United States Patent
Kim et al.

(10) Patent No.: US 8,553,471 B2
(45) Date of Patent: Oct. 8, 2013

(54) DATA OUTPUT BUFFER AND MEMORY DEVICE

(75) Inventors: Si-Hong Kim, Yongin-si (KR);
Seung-Jun Bae, Hwaseong-si (KR);
Jin-Il Lee, Hwaseong-si (KR);
Kwang-Il Park, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 91 days.

(21) Appl. No.: 13/239,478

(22) Filed: Sep. 22, 2011

(65) Prior Publication Data

US 2012/0099383 A1   Apr. 26, 2012

(30) Foreign Application Priority Data

Oct. 20, 2010   (KR) .................. 10-2010-0102178

(51) Int. Cl.
*G11C 7/10* (2006.01)
*G11C 7/00* (2006.01)

(52) U.S. Cl.
USPC ............ 365/189.05; 365/189.11; 365/189.17; 365/198

(58) Field of Classification Search
USPC ................... 365/189.05, 189.17, 189.11, 198
See application file for complete search history.

(56) References Cited

U.S. PATENT DOCUMENTS

| | | | |
|---|---|---|---|
| 6,330,194 B1 * | 12/2001 | Thomann et al. | 365/189.05 |
| 6,949,949 B2 | 9/2005 | Lundberg | |
| 7,109,744 B1 * | 9/2006 | Shumarayev et al. | 326/30 |
| 7,167,020 B2 | 1/2007 | Allan | |
| 7,227,376 B2 | 6/2007 | Ahmad et al. | |
| 7,535,250 B2 | 5/2009 | Batt | |
| 2004/0135605 A1 * | 7/2004 | Chung et al. | 327/158 |
| 2008/0211533 A1 * | 9/2008 | Kim et al. | 326/30 |
| 2010/0164571 A1 * | 7/2010 | Jang et al. | 327/158 |
| 2010/0226189 A1 * | 9/2010 | Choi | 365/194 |
| 2011/0205832 A1 * | 8/2011 | Jeon | 365/233.16 |
| 2011/0242916 A1 * | 10/2011 | Seol et al. | 365/198 |

* cited by examiner

*Primary Examiner* — Ly D Pham
(74) *Attorney, Agent, or Firm* — Volentine & Whitt, PLLC

(57) ABSTRACT

A data output buffer includes a driving unit and a control unit. The driving unit selectively performs a termination operation that provides a termination impedance to a transmission line coupled to an external pin, and a driving operation that provides a drive impedance to the transmission line while outputting read data. The control unit adjusts a value of the termination impedance and a value of the drive impedance based on an output voltage at the external pin during a termination mode, and controls the driving unit to selectively perform one of the termination operation and the driving operation during a driving mode.

24 Claims, 15 Drawing Sheets

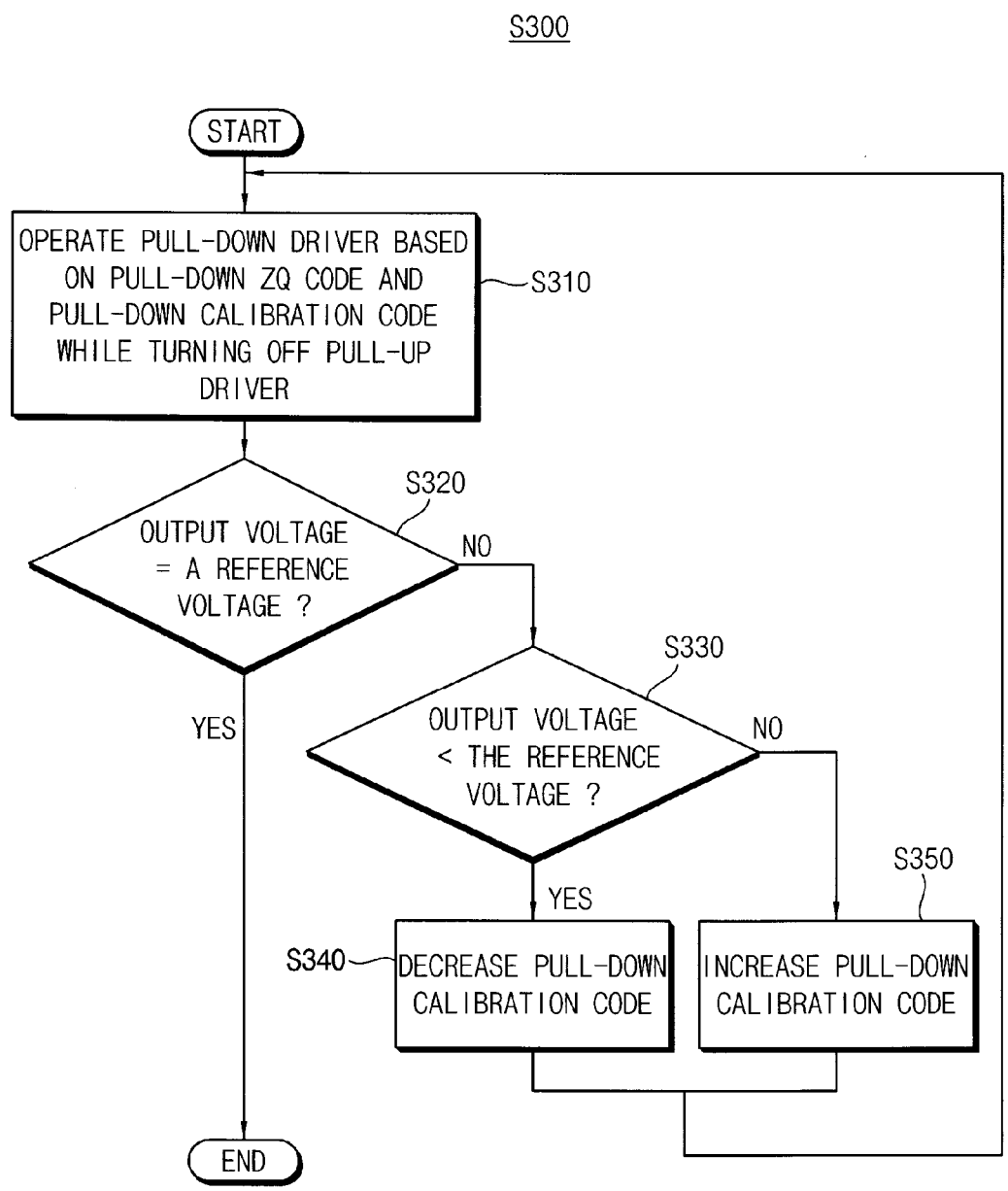

US 8,553,471 B2

DATA OUTPUT BUFFER AND MEMORY DEVICE

CROSS-REFERENCE TO RELATED APPLICATION(S)

This application claims priority under 35 USC §119 to Korean Patent Application No. 10-2010-0102178 filed on Oct. 20, 2010, the subject matter of which is hereby incorporated by reference.

BACKGROUND OF THE INVENTION

The inventive concept relates to memory devices, and more particularly to data output buffers and memory devices including the data output buffer.

Careful consideration must be given to the impedance matching between a memory device, or more particularly the input or output buffer of a memory device, and a connected transmission line. Improperly matched impedances will result in undesirable signal reflections on the transmission line. Such signal reflections degrade the integrity of command, address, and/or data signals being communicated on the transmission line.

Noise has always been a design problem related to data transmission systems, but as memory systems run at ever increasing speeds, potential noise sources and conditions have come under renewed scrutiny. Thus, matching between both the termination impedance and drive impedance of a data output buffer and the impedance of a connected transmission line must be address in any emerging memory system design.

SUMMARY OF THE INVENTION

Certain embodiments of the inventive concept are directed to data output buffers that provide a termination impedance and drive impedance that correctly match the impedance of a connected transmission line. Certain embodiments of the inventive concept are directed to memory devices this type of data output buffer.

Accordingly, an embodiment of the inventive concept provides a data output buffer of a memory device, comprising; an external pin coupled to a transmission line, a driving unit coupled to the external pin and configured to selectively perform a termination operation that presents a termination impedance to the transmission line via the external pin and a driving operation that presents a drive impedance to the transmission line while read data is output to the transmission line via the external pin, and a control unit configured to adjust a value of the termination impedance and a value of the drive impedance based on an output voltage at the external pin during a termination mode of operation for the memory device, and to control the driving unit to selectively perform either the termination operation or the driving operation during a driving mode of operation for the memory device.

Another embodiment of the inventive concept provides a memory device, comprising; a memory core configured to store a data and provide the stored data as read data, and a data output buffer coupled to an external pin, the data output buffer being configured to selectively perform one of a termination operation, in which the data output buffer provides a termination impedance to a transmission line coupled to the external pin, and a driving operation, in which the data output buffer provides a drive impedance to the transmission line while outputting the read data through the transmission line, wherein a value of the termination impedance and a value of the drive impedance are adjusted based on an output voltage at the external pin.

Another embodiment of the inventive concept provides a method of operating a memory system including a memory controller and a memory device having a data output buffer, the method comprising; using the data output buffer, providing a termination impedance at an external pin connected to a transmission line during a termination mode of operation for the memory device, and using the data output buffer, providing a drive impedance at the external pin during a driving mode of operation for the memory device, wherein the a value of the termination impedance and a value of the drive impedance are determined by the data output buffer in response to an output voltage at the external pin.

BRIEF DESCRIPTION OF THE DRAWINGS

Illustrative, non-limiting embodiments of the inventive concept may be understood from a consideration of the following detailed description taken in conjunction with the accompanying drawings.

FIG. 17 is a flow chart for describing the step of adjusting the impedance of a pull-down driver in the operating method of FIG. 15.

DETAILED DESCRIPTION

Certain embodiments of the inventive concept will now be described in some additional detail with reference to the accompanying drawings. The inventive concept may, however, be embodied in many different forms and should not be construed as limited to only the illustrated embodiments. Rather, these embodiments are provided so that this disclosure will be thorough and complete, and will fully convey the scope of the present inventive concept to those skilled in the art. Throughout the written description and drawings, like reference numbers and labels denote like or similar elements.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the inventive concept. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
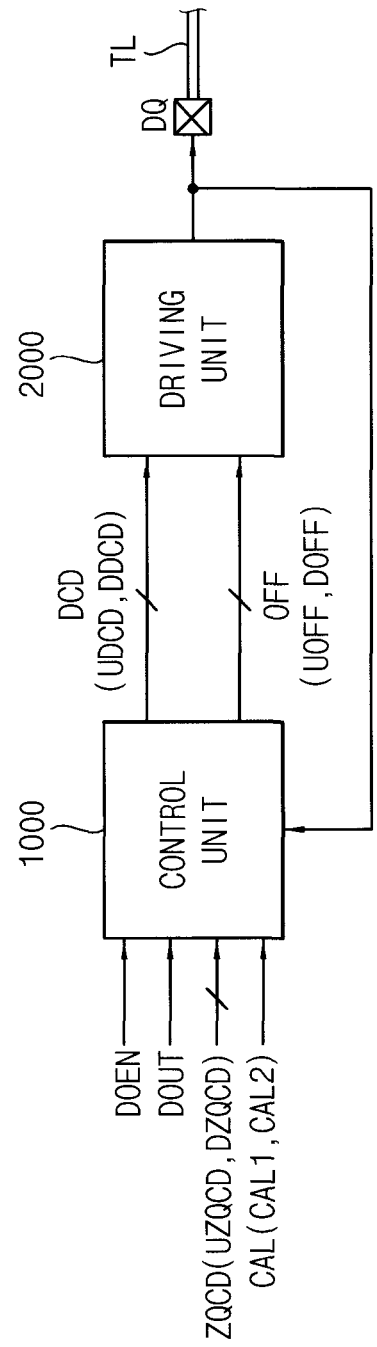
FIG. 1 is a block diagram illustrating a data output buffer of a memory device according to an embodiment of the inventive concept.

FIG. 1 is a block diagram illustrating a data output buffer of a memory device according to an embodiment of the inventive concept.

Referring to FIG. 1, a data output buffer 100 generally comprises a control unit 1000 and a driving unit 2000.

The driving unit 2000 is coupled to an external data output pin DQ. The term "pin" in this regard is used to denote a conventionally understood class of elements and/or circuits that are used to electrically connect or couple a transmission line TL with a connection point of a memory device at which output data is provided. In certain embodiments, the external pin DQ may include one or more of a data input pin, a data output pin, a data strobe (DQS) pin, a data mask (DM) pin, a termination data strobe (TDQS) pin, etc.

The driving unit 2000 selectively performs a termination operation by which the driving unit 2000 presents a termination impedance to the transmission line TL coupled at the external pin DQ. In effect, the driving unit 2000 performs a driving operation which "presents" a properly matched drive impedance to the transmission line TL when read data DOUT is output to the transmission line TL. For coherence of terminology the term "presents" in this context refers to one or more operations by which the driving unit 2000 controls electrical conditions defining an output impedance or "drive impedance" at the external pin DQ as seen by the transmission line TL. Where the drive impedance presented by the data output buffer during a read mode exactly matches the line impedance of the transmission line TL, no signal reflections will be generated.

For example, in certain embodiments of the inventive concept, the driving unit 2000 may perform a termination operation controlling an input impedance during a write mode or a normal mode, and may also perform the termination operation controlling the drive impedance presented by the memory device during a read mode. In this context, the "normal mode" is any mode of operation for the memory device other than the write mode and read mode, and may include, as examples, an idle mode, a pre-charge mode, a power down mode, a refresh mode, a bank active mode, a standby mode, etc.

The value of the drive impedance presented by the driving unit 2000 during the read mode (i.e., during a time period in which read data DOUT is provided to the external pin DQ) may depend on the value of the read data (e.g., a first drive impedance when read data is logically "low" and a second drive impedance when read data is logically "high").

The control unit 1000 receive a data signal apparent at the external pin DQ. During the normal mode or the write mode, the control unit 1000 performs a termination operation that adjusts the termination impedance in accordance with the data signal. During the read mode, the control unit 1000 performs a driving operation that adjusts the drive impedance presented by the driving unit 2000. Thus, the control unit 1000 may selectively performs the termination operation or the driving operation in response to the operative mode of the constituent memory device.

The control unit 1000 may further perform the termination operation or the driving operation in response to a received calibration signal CAL. That is, the operating mode of the control unit 1000 may be determined, at least in part, by the applied calibration signal CAL. In certain embodiments of the inventive concept, the control unit 1000 will receive the calibration signal CAL from a memory controller (not illustrated).

The control unit 1000 may be used to generate a driving code DCD and a turn off code OFF in response to an output enable signal DOEN, the read data DOUT, a ZQ code ZQCD and the calibration signal CAL. The control unit 1000 provides the driving code DCD and the turn off code OFF to the driving unit 2000 so that the driving unit 2000 may selectively perform the termination operation or the driving operation to properly adjust the impedance presented by the driving unit 2000. In certain embodiments, the control unit 1000 may receive the ZQ code ZQCD from a ZQ calibration circuit (not illustrated). The ZQ code ZQCD may include a pull-up ZQ code UZQCD and a pull-down ZQ code DZQCD. The driving code DCD may include a pull-up driving code UDCD and a pull-down driving code DDCD. The turn off code OFF may include a pull-up turn off code UOFF and a pull-down turn off code DOFF. The calibration signal CAL may include a first calibration signal CAL1 and a second calibration signal CAL2.

Contemporary memory devices includes a plurality of external pins, and each of a plurality of data output buffers is respectively coupled to the plurality of external pins. Conventional data output buffers use a common ZQ code, which is provided from a ZQ calibration circuit connected to a ZQ pin to determine a termination impedance and a drive impedance. Therefore, the termination impedance and drive impedance provided by conventional data output buffers must be the same. However, in contemporary memory systems each memory device may be connected to differing power routings for constituent data output buffers that vary by location of the external pins on the memory device. Hence, the respective impedances of the external pins will be different. Therefore, the termination impedance and/or the drive impedance provided by conventional data buffers do not exactly match the line impedance of a transmission line coupled to each of the external pins.

In contrast, the data output buffer 100 of FIG. 1 according to an embodiment of the inventive concept receives "an output voltage" apparent at the external pin DQ as a feedback signal, and adjusts the termination impedance and drive impedance based on the actual voltage apparent at the external pin DQ. Therefore, the data output buffer 100 according to an embodiment of the inventive concept may provide a termination impedance and a drive impedance that exactly match to a line impedance for a connected transmission line TL.

Figure 2:
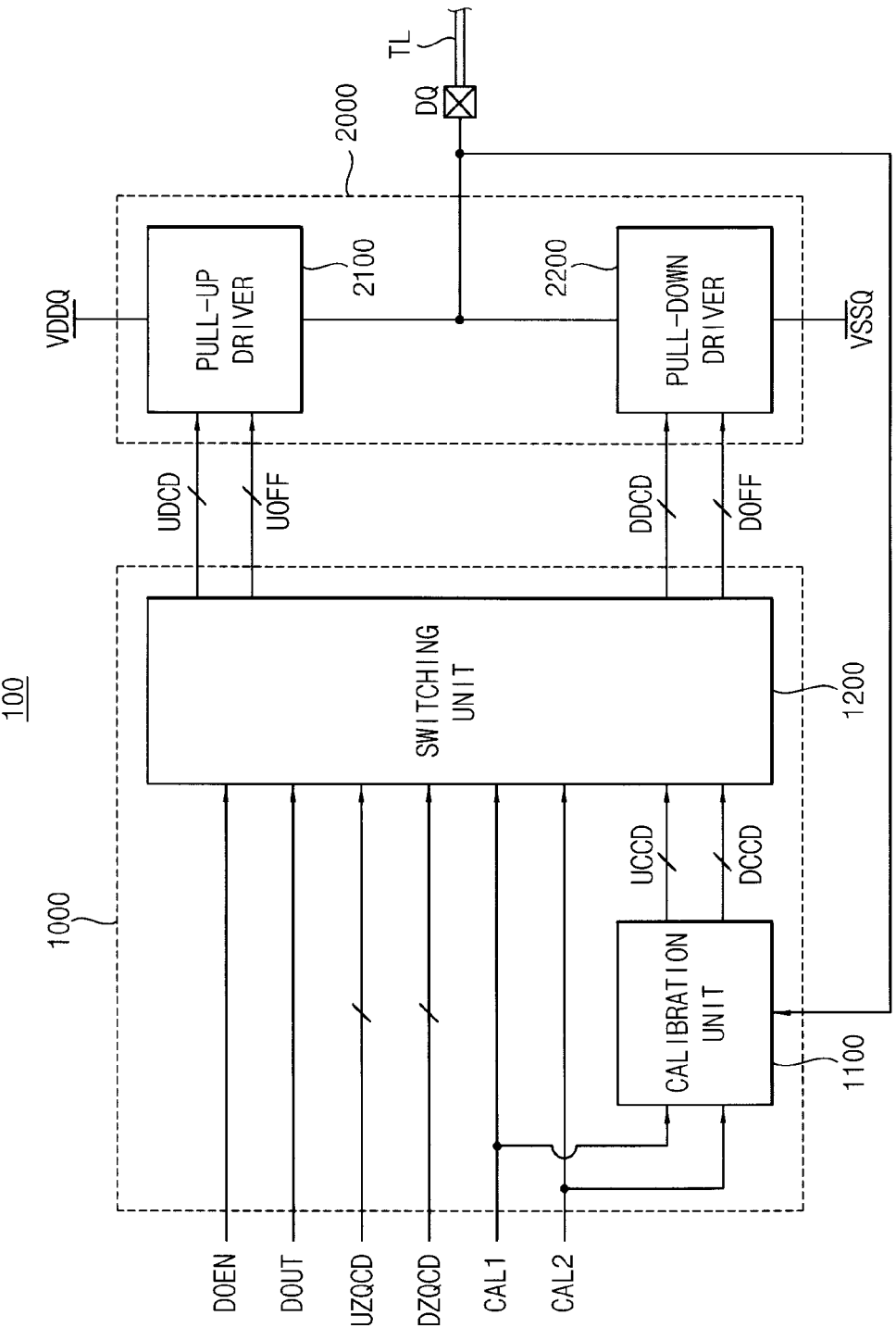
FIG. 2 is a block diagram further illustrating the data output buffer of FIG. 1.

FIG. 2 is a block diagram further illustrating the data output buffer 100 of FIG. 1.

In the illustrated example of FIG. 2, the control unit 1000 comprises a calibration unit 1100 and a switching unit 1200, and the driving unit 2000 comprises a pull-up driver 2100 and a pull-down driver 2200.

The pull-up driver 2100 is coupled between a supply voltage VDDQ and the external pin DQ. The pull-up driver 2100 provides an adjustable impedance between the supply voltage VDDQ and the external pin DQ in response to the pull-up driving code UDCD received from the control unit 1000. The pull-up driver 2100 may be turned off in response to the pull-up turn off code UOFF received from the control unit 1000.

The pull-down driver 2200 is coupled between the external pin DQ and a ground voltage VSSQ. The pull-down driver 2200 provide an adjustable impedance between the external pin DQ and the ground voltage VSSQ in response to the pull-down driving code DDCD received from the control unit 1000. The pull-down driver 2200 may be turned off in response to the pull-down turn off code DOFF received from the control unit 1000.

The operating mode of the control unit 1000 may be determined by the level of the first calibration signal CAL1. For example, the control unit 1000 may operate in the termination mode when the first calibration signal CAL1 is high (or enabled), and in the driving mode when the first calibration signal CAL1 is low (or disabled).

During the termination mode, the control unit 1000 may be used to generate the pull-up driving code UDCD and the pull-down driving code DDCD by comparing the output voltage at the external pin DQ with a reference voltage. During the driving mode, the control unit 1000 may be used to provide the pull-up driving code UDCD to the pull-up driver 2100 to operate the pull-up driver 2100 while turning off the pull-down driver 2200 by providing the pull-down turn off code DOFF to the pull-down driver 2200, or provide the pull-down driving code DDCD to the pull-down driver 2200 to operate the pull-down driver 2200 while turning off the pull-up driver 2100 by providing the pull-up turn off code UOFF to the pull-up driver 2100.

More specifically, the calibration unit 1100 included in the control unit 1000 may be used generate a pull-up calibration code UCCD and a pull-down calibration code DCCD by comparing the output voltage of the external pin DQ with the reference voltage in response to the first calibration signal CAL1 and the second calibration signal CAL2.

The calibration unit 1100 will operate in the termination mode while the first calibration signal CAL1 is high, and will operate in the driving mode while the first calibration signal CAL1 is low. In the termination operation mode, the calibration unit 1100 updates the pull-up calibration code UCCD when the second calibration signal CAL2 is high, and updates the pull-down calibration code DCCD when the second calibration signal CAL2 is low. In the driving mode, the calibration unit 1100 will provide the pull-up calibration code UCCD and the pull-down calibration code DCCD to the switching unit 1200. For example, as assumed above, the first calibration signal CAL1 and the second calibration signal CAL2 may be enabled when high and disabled when low. Alternatively, the first calibration signal CAL1 and the second calibration signal CAL2 may be enabled when low and disabled when high.

The switching unit 1200 will generate the pull-up driving code UDDC and the pull-down driving code DDCD based on the pull-up calibration code UCCD, the pull-down calibration code DCCD, the pull-up ZQ code UZQCD and the pull-down ZQ code DZQCD. The switching unit 1200 will provide the pull-up driving code UDCD to the pull-up driver 2100 to operate the pull-up driver 2100 while turning off the pull-down driver 2200 by providing the pull-down turn off code DOFF to the pull-down driver 2200, or provide the pull-down driving code DDCD to the pull-down driver 2200 to operate the pull-down driver 2200 while turning off the pull-up driver 2100 by providing the pull-up turn off code UOFF to the pull-up driver 2100 in response to the output enable signal DOEN, the read data DOUT, the first calibration signal CAL1 and the second calibration signal CAL2.

More specifically as shown in the working illustrative embodiment, in the termination mode, the switching unit 1200 provides the pull-up driving code UDCD to the pull-up driver 2100 to operate the pull-up driver 2100 while turning off the pull-down driver 2200 by providing the pull-down turn off code DOFF to the pull-down driver 2200, or provide the pull-down driving code DDCD to the pull-down driver 2200 to operate the pull-down driver 2200 while turning off the pull-up driver 2100 by providing the pull-up turn off code UOFF to the pull-up driver 2100 in response to the logic state of the second calibration signal CAL2. By comparison, in the driving mode, the switching unit 1200 may provide the pull-up driving code UDCD to the pull-up driver 2100 to operate the pull-up driver 2100 while turning off the pull-down driver 2200 by providing the pull-down turn off code DOFF to the pull-down driver 2200, or provide the pull-down driving code DDCD to the pull-down driver 2200 to operate the pull-down driver 2200 while turning off the pull-up driver 2100 by providing the pull-up turn off code UOFF to the pull-up driver 2100 in response to a result of an AND operation between the output enable signal DOEN and an inverted version of the read data DOUT.

An initial impedance of the pull-up driver 2100 may be determined by the pull-up ZQ code UZQCD, and the impedance of the pull-up driver 2100 may be minutely adjusted by a change of the pull-up calibration code UCCD so that the impedance of the pull-up driver 2100 matches the line impedance of the transmission line TL. Therefore, a number of bits of the pull-up calibration code UCCD may be less than a number of bits of the pull-up ZQ code UZQCD.

An initial impedance of the pull-down driver 2200 may be determined by the pull-down ZQ code DZQCD, and the impedance of the pull-down driver 2200 may be minutely adjusted by a change of the pull-down calibration code DCCD so that the impedance of the pull-down driver 2200 matches the line impedance of the transmission line TL. Therefore, a number of bits of the pull-down calibration code DCCD may be less than a number of bits of the pull-down ZQ code DZQCD.

Figure 3:
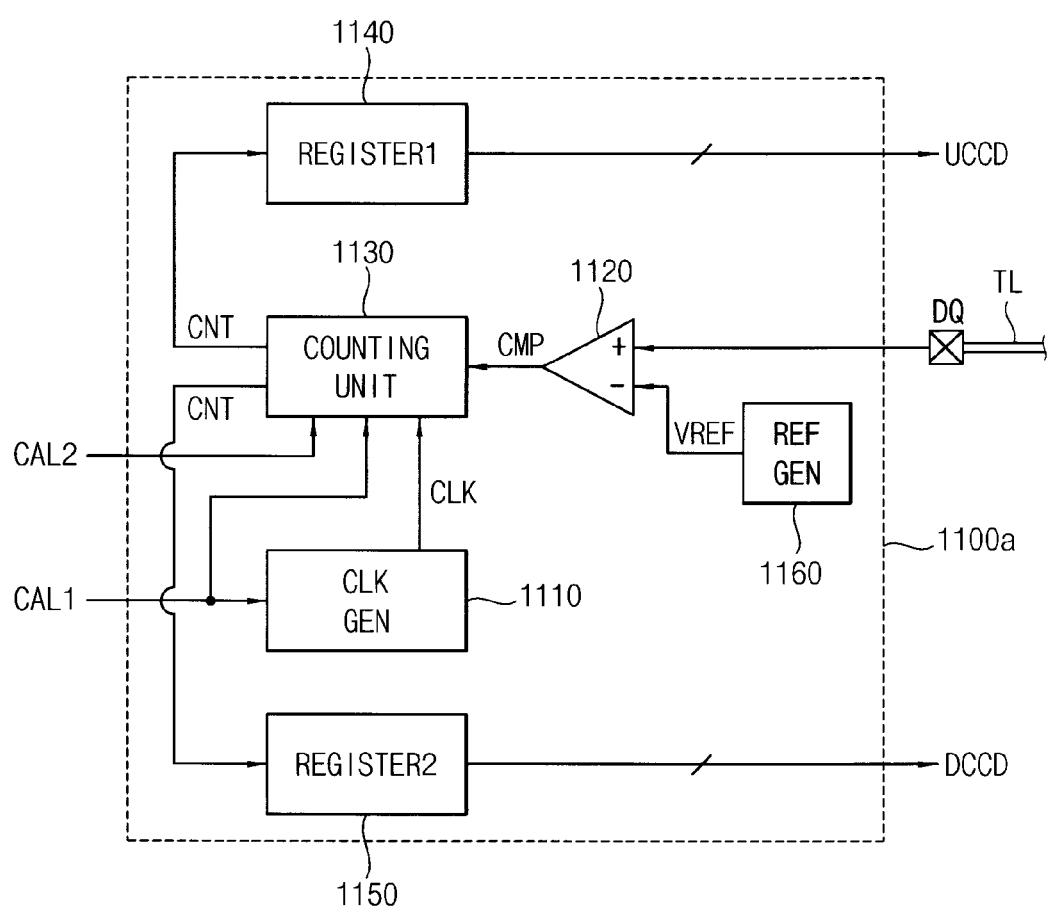
FIG. 3 is a block diagram further illustrating one possible calibration unit that might be incorporated within the data output buffer of FIG. 2.

FIG. 3 is a block diagram further illustrating one possible example of a calibration unit included within the data output buffer of FIG. 2.

Referring to FIG. 3, the calibration unit 1100*a* comprises a clock generator CLKGEN 1110, a comparator 1120, a counting unit 1130, a first register 1140 and a second register 1150.

The clock generator 1110 generates a clock signal CLK and provides the clock signal CLK to the counting unit 1130 while the first calibration signal CAL1 is enabled. The clock generator 1110 may stop generation of the clock signal CLK while the first calibration signal CAL1 is disabled.

The comparator 1120 generates a comparison signal CMP by comparing the output voltage at the external pin DQ with the reference voltage VREF. For example, the comparator 1120 may generate a low comparison signal CMP when the output voltage at the external pin DQ is less than the reference voltage VREF, and generate a high comparison signal CMP when the output voltage at the external pin DQ is greater than the reference voltage VREF.

The counting unit 1130 may be used to generate a counting value CNT by performing a count-up operation or a count-down operation in response to the clock signal CLK and the comparison signal CMP. The counting unit 1130 may perform the count-up operation or count-down operation in the termination mode, and stop performing the count-up operation or count-down operation in driving mode since the clock generator 1110 provides the clock signal CLK to the counting unit 1130 only in the termination mode. In certain embodiments, the counting unit 1130 may perform the count-up operation when the comparison signal CMP is high, and perform the count-down operation when the comparison signal CMP is low.

Figure 4:
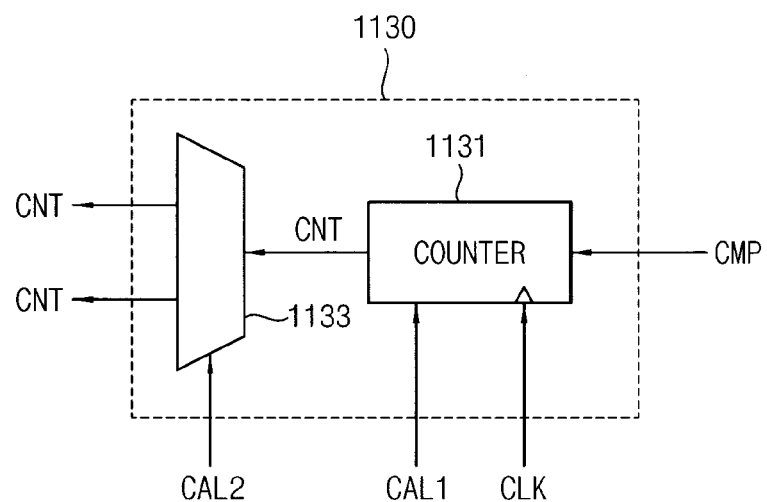
FIG. 4 is a block diagram further illustrating one possible example of a counting unit that might be incorporated within the calibration unit of FIG. 3.

FIG. 4 is a block diagram further illustrating one possible example of the counting unit 1130 of FIG. 3. Referring to FIG. 4, the counting unit 1130 comprises a counter 1131 and a de-multiplexer 1133.

The counter 1131 generates the counting value CNT by performing the count-up operation or the count-down operation synchronously with the clock signal CLK in response to the logic level of the comparison signal CMP. The counter 1131 may reset the counting value CNT when the first calibration signal CAL1 is enabled. For example, the counter 1131 may perform the count-up operation synchronously with the clock signal CLK when the comparison signal CMP is high, and perform the count-down operation synchronously with the clock signal CLK when the comparison signal CMP is low.

The de-multiplexer 1133 may be used to selectively provide the counting value CNT to one of the first register 1140 and the second register 1150 in response to the second calibration signal CAL2. For example, the de-multiplexer 1133 may provide the counting value CNT to the first register 1140 when the second calibration signal CAL2 is high, and provide the counting value CNT to the second register 1150 when the second calibration signal CAL2 is low.

Referring again to FIG. 3, the first register 1140 may be used to store the counting value CNT received from the counting unit 1130, and provide the stored counting value as the pull-up calibration code UCCD. The second register 1150 may store the counting value CNT received from the counting unit 1130, and provide the stored counting value as the pull-down calibration code DCCD.

Figure 5:
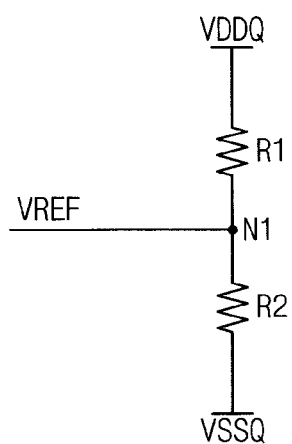
FIG. 5 is a circuit diagram further illustrating one possible of a reference voltage generator that might be included within the calibration unit of FIG. 3.

As shown in the illustrated example, of FIG. 3, the calibration unit 1100*a* may also include a reference voltage generator REFGEN 1160 that generates the reference voltage VREF. FIG. 5 is a circuit diagram further illustrating one possible example of a reference voltage generator that may be included in the calibration unit of FIG. 3.

Referring to FIG. 5, the reference voltage generator 1160 includes a first resistor R1 coupled between the supply voltage VDDQ and a first node N1 and a second resistor R2 coupled between the first node N1 and the ground voltage VSSQ. The reference voltage generate 1160 may output the reference voltage VREF at the first node N1.

As will be described later with reference to FIG. 14, a memory controller coupled to the external pin DQ via the transmission line TL, may operate in a pull-down mode while the calibration unit 1100*a* updates the pull-up calibration code UCCD in response to a high second calibration signal CAL2 during the termination mode. Therefore, a ratio between the first resistor R1 and second resistor R2 may be the same as a ratio between a target impedance of the pull-up driver 2100 and a pull-down impedance of the memory controller. The memory controller may operate in a pull-up mode while the calibration unit 1100*a* updates the pull-down calibration code DCCD in response to a low second calibration signal CAL2 in the termination mode. Therefore, a ratio between the first resistor R1 and the second resistor R2 may be the same as a ratio between a pull-up impedance of the memory controller and a target impedance of the pull-down driver 2200.

Since the calibration unit 1100*a* illustrated in FIG. 3 updates the pull-up calibration code UCCD and the pull-down calibration code DCCD using the same reference voltage generator 1160, the calibration unit 1100*a* may be used when the ratio of the target impedance of the pull-up driver 2100 to the pull-down impedance of the memory controller is the same as the ratio of the pull-up impedance of the memory controller to the target impedance of the pull-down driver 2200. For example, the target impedance of the pull-up driver 2100 and the pull-up impedance of the memory controller may be 60 ohms, and the target impedance of the pull-down driver 2200 and the pull-down impedance of the memory controller may be 40 ohms.

Figure 6:
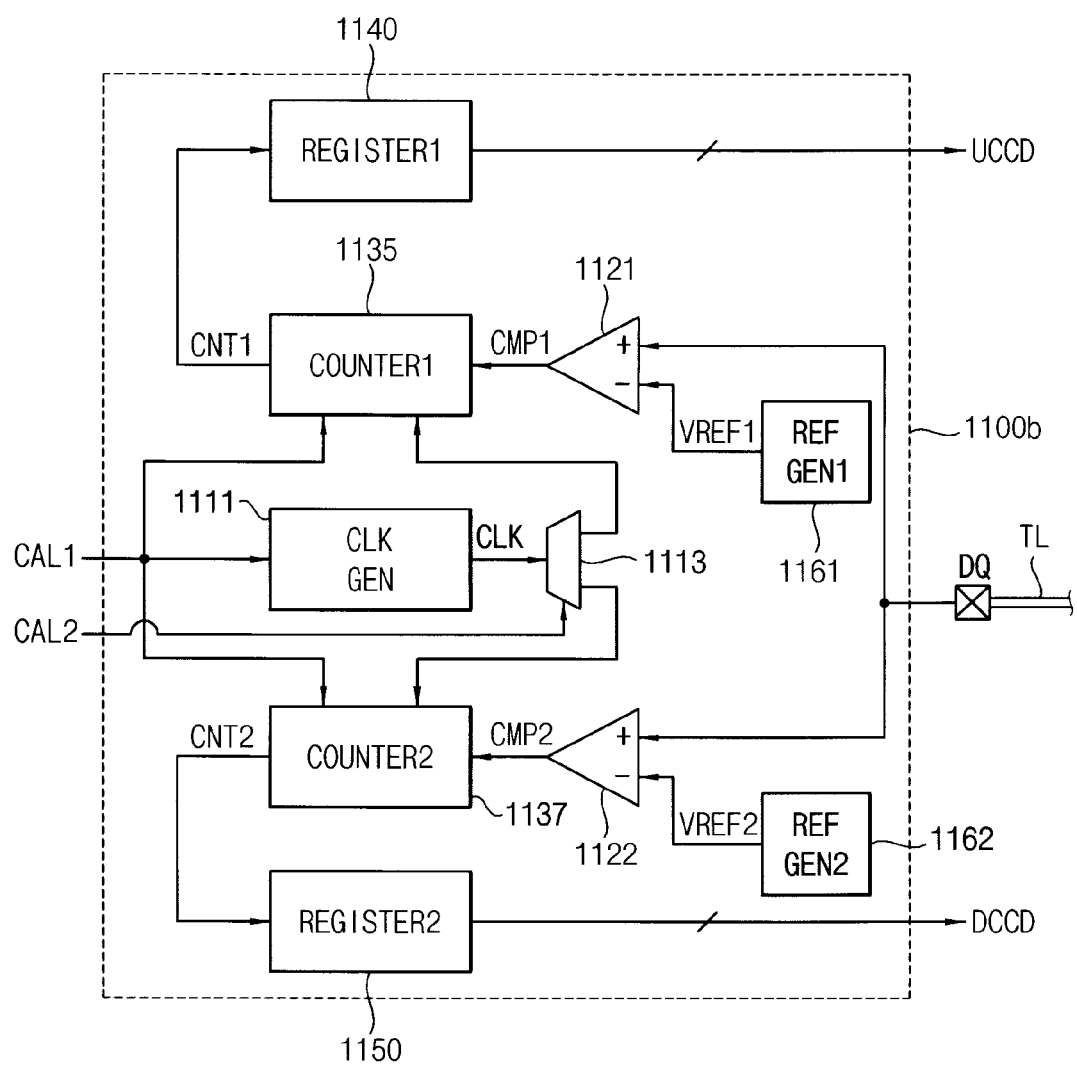
FIG. 6 is a block diagram further illustrating another possible calibration unit that might be incorporated within the data output buffer of FIG. 2.

FIG. 6 is a block diagram illustrating another possible example of a calibration unit that might be included in the data output buffer of FIG. 2.

Referring to FIG. 6, a calibration unit 1100*b* may comprises a clock generator CLKGEN 1111, a de-multiplexer 1113, a first comparator 1121, a second comparator 1122, a first counter 1135, a second counter 1137, a first register 1140 and a second register 1150.

The clock generator 1111 may be used to generate a clock signal CLK when the first calibration signal CAL1 is enabled, and may stop generating the clock signal CLK when the first calibration signal CAL1 is disabled.

The de-multiplexer 1113 may be sued to provide the clock signal CLK to one of the first counter 1135 and the second counter 1137 in response to the second calibration signal CAL2. For example, the de-multiplexer 1113 may provide the clock signal CLK to the first counter 1135 when the second calibration signal CAL2 is high, and provide the clock signal CLK to the second counter 1137 when the second calibration signal CAL2 is low.

The first comparator 1121 may be used to generate a first comparison signal CMP1 by comparing the output voltage at the external pin DQ with a first reference voltage VREF1. For example, the first comparator 1121 may generate a low first comparison signal CMP1 when the output voltage at the external pin DQ is less than the first reference voltage VREF1, and a high first comparison signal CMP1 when the output voltage at the external pin DQ is greater than the first reference voltage VREF1.

The second comparator 1122 may generate a second comparison signal CMP2 by comparing the output voltage at the external pin DQ with a second reference voltage VREF2. For example, the second comparator 1122 may generate a low second comparison signal CMP2 when the output voltage at the external pin DQ is less than the second reference voltage VREF2, and a high second comparison signal CMP2 when the output voltage at the external pin DQ is greater than the second reference voltage VREF2.

The first counter 1135 may be sued to generate a first counting value CNT1 by performing a count-up operation or a count-down operation synchronously with the clock signal CLK based on the logic level of the first comparison signal CMP1. The first counter 1135 may reset the first counting value CNT1 when the first calibration signal CAL1 is enabled. For example, the first counter 1135 may perform the count-up operation synchronously with the clock signal CLK when the first comparison signal CMP1 is high, and perform the count-down operation synchronously with the clock signal CLK when the first comparison signal CMP1 is low.

The second counter 1137 may generate a second counting value CNT2 by performing the count-up operation or count-down operation synchronously with the clock signal CLK based on the logic level of the second comparison signal CMP2. The second counter 1137 may reset the second counting value CNT2 when the first calibration signal CAL1 is enabled. For example, the second counter 1137 may perform the count-up operation synchronously with the clock signal CLK when the second comparison signal CMP2 is high, and the count-down operation synchronously with the clock signal CLK when the second comparison signal CMP2 is low.

The first register 1140 may be used to store the first counting value CNT1 received from the first counter 1135, and provide the stored first counting value as the pull-up calibration code UCCD. The second register 1150 may be sued to store the second counting value CNT2 received from the second counter 1137, and provide the stored second counting value as the pull-down calibration code DCCD.

The calibration unit 1100b may further include a first reference voltage generator REFGEN1 1161 that generates the first reference voltage VREF1 and a second reference voltage generator REFGEN2 1162 that generates the second reference voltage VREF2. The first reference voltage generator 1161 and the second reference voltage generator 1162 may have the same structure as the reference voltage generator 1160 of FIG. 5. However, resistances of the first resistor R1 and the second resistor R2 of the first reference voltage generator 1161 may be different from resistances of the first resistor R1 and the second resistor R2 of the second reference voltage generator 1162, respectively.

The calibration unit 1100b of FIG. 6 may update the pull-up calibration code UCCD using the first reference voltage generator 1161, and update the pull-down calibration code DCCD using the second reference voltage generator 1162.

Therefore, as described above with reference to FIG. 5, a ratio of the first resistor R1 to the second resistor R2 of the first reference voltage generator 1161 may be the same as the ratio of the target impedance of the pull-up driver 2100 to the pull-down impedance of the memory controller, and a ratio of the first resistor R1 to the second resistor R2 of the second reference voltage generator 1162 may be the same as the ratio of the pull-up impedance of the memory controller to the target impedance of the pull-down driver 2200. Therefore, the calibration unit 1100b of FIG. 6 may be used when the ratio of the target impedance of the pull-up driver 2100 to the pull-down impedance of the memory controller is different from the ratio of the pull-up impedance of the memory controller to the target impedance of the pull-down driver 2200.

Figure 7:
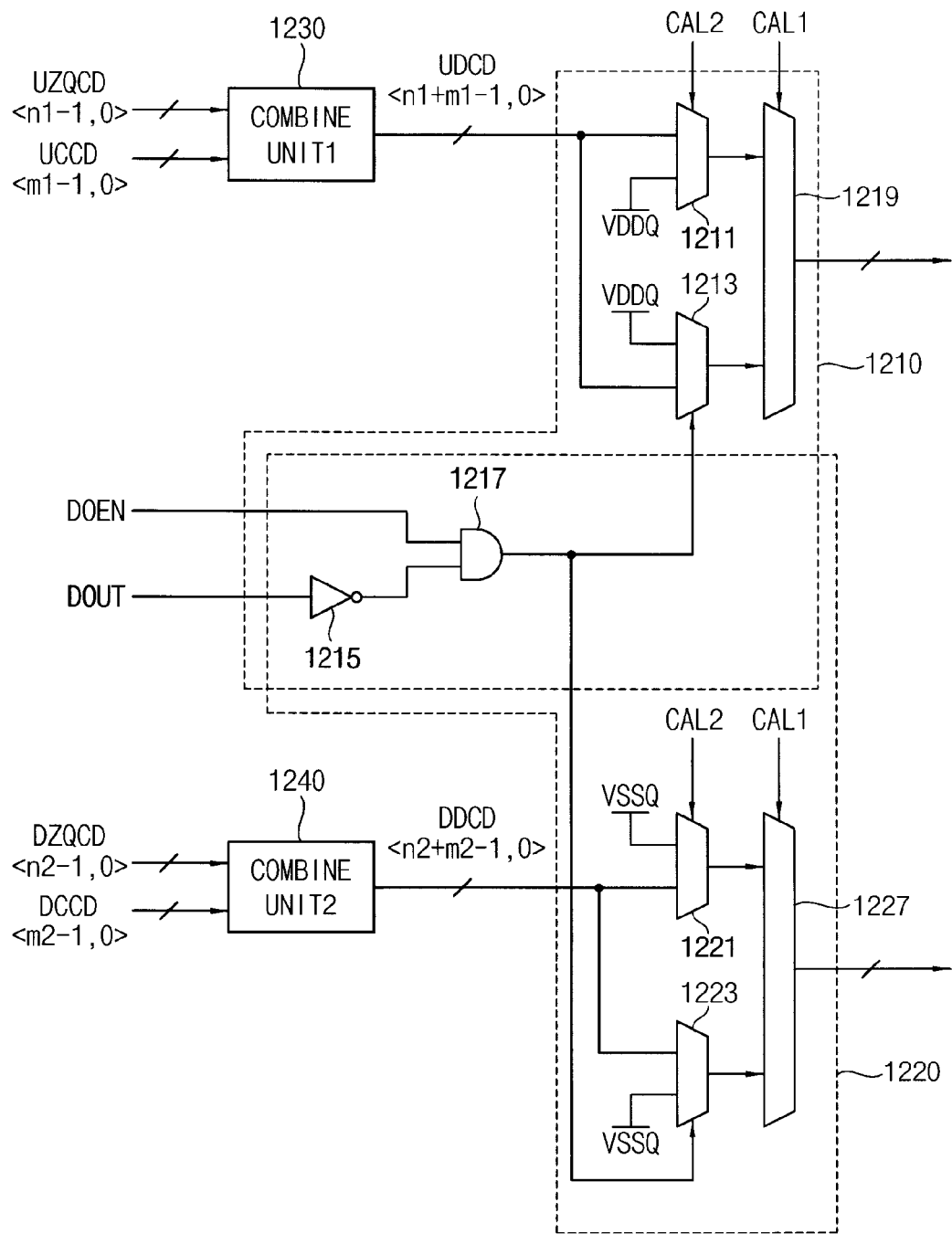
FIG. 7 is a block diagram further illustrating one possible example of a switching unit that might be incorporated within the data output buffer of FIG. 2.

FIG. 7 is a block diagram further illustrating one possible example of a switching unit that may be incorporated in the memory device 100 of FIG. 2. Referring to FIG. 7, a switching unit 1200a comprises a first combine unit 1230, a second combine unit 1240, a first selection unit 1210 and a second selection unit 1220.

In FIG. 7, the pull-up ZQ code UZQCD has n1-bits, the pull-down ZQ code DZQCD has n2-bits, the pull-up calibration code UCCD has m1-bits and the pull-down calibration code DCCD has m2-bits, where n1, n2, m1 and m2 are positive integers.

As described above, a number of bits of the pull-up calibration code UCCD, which is m1, may be less than a number of bits of the pull-up ZQ code UZQCD, which is n1. A number of bits of the pull-down calibration code DCCD, which is m2, may be less than a number of bits of the pull-down ZQ code DZQCD, which is n2.

The first combine unit 1230 may generate the pull-up driving code UDCD by combining bits of the pull-up calibration code UCCD to the end of bits of the pull-up ZQ code UZQCD. For example, the first combine unit 1230 may generate the pull-up driving code UDCD having (n1+m1)-bits by combining m1-bits of the pull-up calibration code UCCD to the right end of n1-bits of the pull-up ZQ code UZQCD. Alternatively, the first combine unit 1230 may generate the pull-up driving code UDCD having (n1+m1)-bits by combining m1-bits of the pull-up calibration code UCCD to the left end of n1-bits of the pull-up ZQ code UZQCD.

The second combine unit 1240 may generate the pull-down driving code DDCD by combining bits of the pull-down calibration code DCCD to the end of bits of the pull-down ZQ code DZQCD. For example, the second combine unit 1240 may generate the pull-down driving code DDCD having (n2+m2)-bits by combining m2-bits of the pull-down calibration code DCCD to the right end of n2-bits of the pull-down ZQ code DZQCD. Alternatively, the second combine unit 1240 may generate the pull-down driving code DDCD having (n2+m2)-bits by combining m2-bits of the pull-down calibration code DCCD to the left end of n2-bits of the pull-down ZQ code DZQCD.

The first selection unit 1210 may provide the pull-up turn off code UOFF, which is used for turning off the pull-up driver 2100, or the pull-up driving code UDCD to the pull-up driver 2100 in response to the output enable signal DOEN, the read data DOUT, the first calibration signal CAL1 and the second calibration signal CAL2. As will be described later, the pull-up driver 2100 may include a p-type metal oxide semiconductor (PMOS) transistor. Therefore, the supply voltage VDDQ may be the pull-up turn off code UOFF.

The first selection unit 1210 may include a first multiplexer 1211, a second multiplexer 1213, a first inverter 1215, a first AND gate 1217 and a third multiplexer 1219.

The first multiplexer 1211 may output one of the supply voltage VDDQ and the pull-up driving code UDCD in response to the second calibration signal CAL2. For example, the first multiplexer 1211 may output the pull-up driving code UDCD when the second calibration signal CAL2 is high, and output the supply voltage VDDQ when the second calibration signal CAL2 is low.

The first inverter 1215 may generate an inverted data by inverting the read data DOUT.

The first AND gate 1217 may perform an AND operation on the output enable signal DOEN and the inverted data received from the first inverter 1215.

The second multiplexer 1213 may output one of the supply voltage VDDQ and the pull-up driving code UDCD in response to an output signal of the first AND gate 1217. For example, the second multiplexer 1213 may output the supply voltage VDDQ when the output signal of the first AND gate 1217 has a logic high level, and output the pull-up driving code UDCD when the output signal of the first AND gate 1217 has a logic low level.

The third multiplexer 1219 may provide one of an output signal of the first multiplexer 1211 and an output signal of the second multiplexer 1213 to the pull-up driver 2100 in response to the first calibration signal CAL1 For example, the third multiplexer 1219 may output the output signal of the first multiplexer 1211 when the first calibration signal CAL1 is high, and output the output signal of the second multiplexer 1213 when the first calibration signal CAL1 is low.

The second selection unit 1220 may provide the pull-down turn off code DOFF, which is used for turning off the pull-down driver 2200, or the pull-down driving code DDCD to the pull-down driver 2200 in response to the output enable signal DOEN, the read data DOUT, the first calibration signal CAL1 and the second calibration signal CAL2. As will be described later, the pull-down driver 2200 may include an n-type metal oxide semiconductor (NMOS) transistor. Therefore, the ground voltage VSSQ may be the pull-down turn off code DOFF.

The second selection unit 1220 may include a fourth multiplexer 1221, a fifth multiplexer 1223, the first inverter 1215, the first AND gate 1217 and a sixth multiplexer 1229.

The fourth multiplexer 1221 may output one of the ground voltage VSSQ and the pull-down driving code DDCD in response to the second calibration signal CAL2. For example, the fourth multiplexer 1221 may output the ground voltage VSSQ when the second calibration signal CAL2 is high, and output the pull-down driving code DDCD when the second calibration signal CAL2 is low.

The fifth multiplexer 1223 may output one of the ground voltage VSSQ and the pull-down driving code DDCD in response to the output signal of the first AND gate 1217. For example, the fifth multiplexer 1223 may output the pull-down driving code DDCD when the output signal of the first AND gate 1217 is high, and output the ground voltage VSSQ when the output signal of the first AND gate 1217 is low.

The sixth multiplexer 1229 may provide one of an output signal of the fourth multiplexer 1221 and an output signal of the fifth multiplexer 1223 to the pull-down driver 2200 in response to the first calibration signal CAL1 For example, the sixth multiplexer 1229 may output the output signal of the fourth multiplexer 1221 when the first calibration signal CAL1 is high, and output the output signal of the fifth multiplexer 1223 when the first calibration signal CAL1 is low.

Hereinafter, operations of the first selection unit 1210 and the second selection unit 1220 will be described.

During the termination mode, in which the first calibration signal CAL1 is assumed to be high, the first selection unit 1210 and the second selection unit 1220 may determine an output signal in response to the second calibration signal CAL2. For example, the first selection unit 1210 may provide the pull-up driving code UDCD to the pull-up driver 2100 to adjust the impedance of the pull-up driver 2100 and the second selection unit 1220 may provide the ground voltage VSSQ, which is the pull-down turn off code DOFF, to the pull-down driver 2200 to turn off the pull-down driver 2200 when the second calibration signal CAL2 is high. The first selection unit 1210 may provide the supply voltage VDDQ, which is the pull-up turn off code UOFF, to the pull-up driver 2100 to turn off the pull-up driver 2100 and the second selection unit 1220 may provide the pull-down driving code DDCD to the pull-down driver 2200 to adjust the impedance of the pull-down driver 2200 when the second calibration signal CAL2 is low.

During the driving mode, in which the first calibration signal CAL1 is assumed to be low, the first selection unit 1210 and the second selection unit 1220 may determine an output signal in response to the output enable signal DOEN and the read data DOUT. For example, the first selection unit 1210 may provide the supply voltage VDDQ, which is the pull-up turn off code UOFF, to the pull-up driver 2100 to turn off the pull-up driver 2100 and the second selection unit 1220 may provide the pull-down driving code DDCD to the pull-down driver 2200 to operate pull-down driver 2200 when the output enable signal DOEN is high, which represents the read mode, and the read data DOUT is low. The first selection unit 1210 may provide the pull-up driving code UDCD to the pull-up driver 2100 to operate the pull-up driver 2100 and the second selection unit 1220 may provide the ground voltage VSSQ, which is the pull-down turn off code DOFF, to the pull-down driver 2200 to turn off the pull-down driver 2200 when the output enable signal DOEN has a logic high level, which represents the read mode, and the read data DOUT is high, or when the output enable signal DOEN is low, which represents the write mode or the normal mode.

As described above, the driving unit 2000 may perform a pull-up termination operation during the write mode and the normal mode since the pull-up driver 2100 is turned on and the pull-down driver 2200 is turned off during the write mode and the normal mode.

Figure 8:
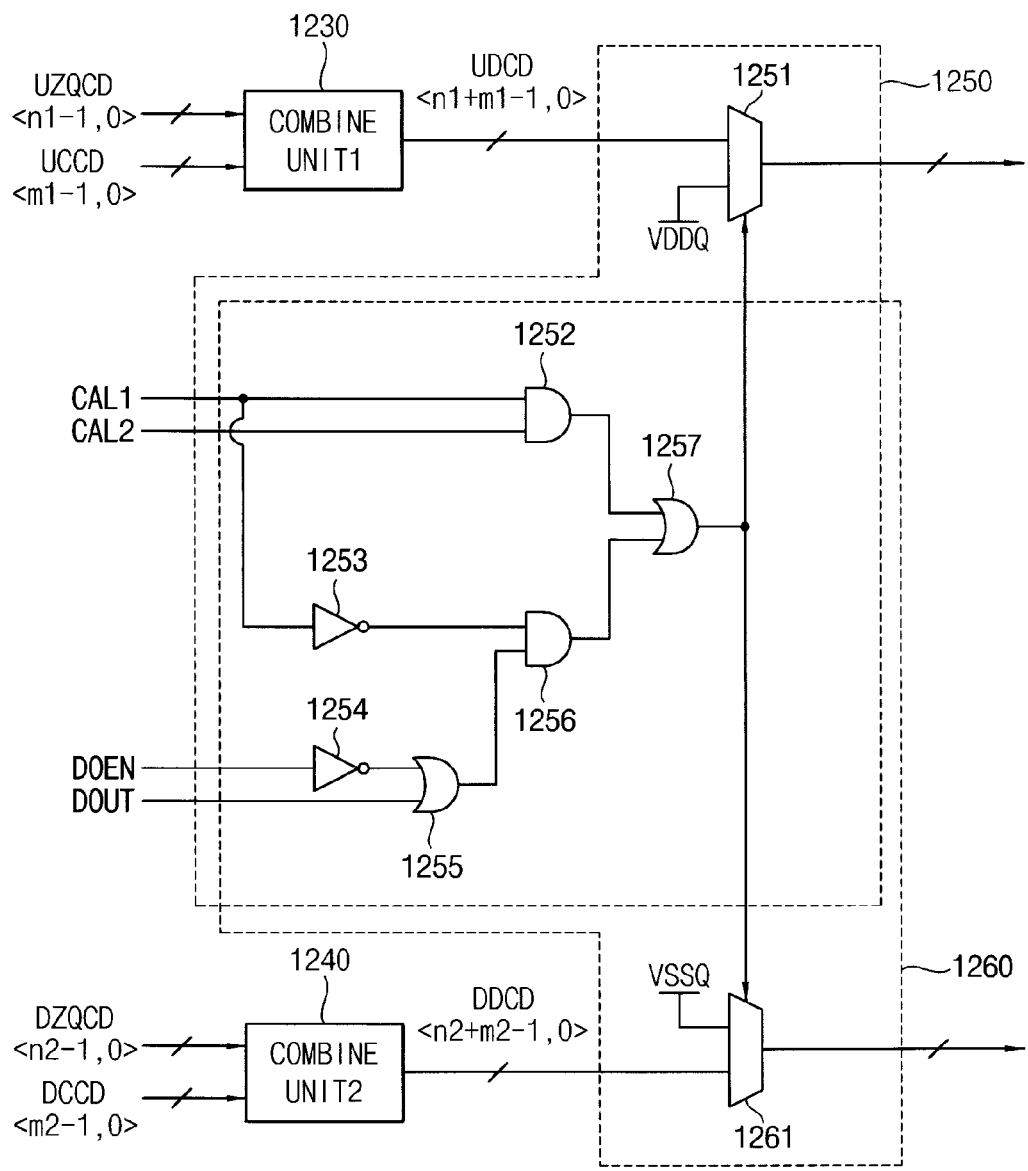
FIG. 8 is a block diagram further illustrating another possible example of a switching unit that might be incorporated within the data output buffer of FIG. 2.

FIG. 8 is a block diagram further illustrating another possible example of a switching unit that might be incorporated in the data output buffer of FIG. 2.

Referring to FIG. 8, a switching unit 1200b comprises the first combine unit 1230, the second combine unit 1240, a third selection unit 1250 and a fourth selection unit 1260.

The first combine unit 1230 and the second combine unit 1240 included in the switching unit 1200b of FIG. 8 may have the same structure and operation as the first combine unit 1230 and the second combine unit 1240 included in the switching unit 1200a of FIG. 7. Therefore, a detail description of the first combine unit 1230 and the second combine unit 1240 will be omitted.

The third selection unit 1250 may include a seventh multiplexer 1251, a second AND gate 1252, a second inverter 1253, a third inverter 1254, a first OR gate 1255, a third AND gate 1256 and a second OR gate 1257.

The second AND gate 1252 may perform an AND operation on the first calibration signal CAL1 and the second calibration signal CAL2. The second inverter 1253 may invert the first calibration signal CAL1. The third inverter 1254 may invert the output enable signal DOEN. The first OR gate 1255 may perform an OR operation on an output signal of the third inverter 1254 and the read data DOUT. The third AND gate 1256 may perform an AND operation on an output signal of the second inverter 1253 and an output signal of the first OR gate 1255. The second OR gate 1257 may perform an OR operation on an output signal of the second AND gate 1252 and an output signal of the third AND gate 1256.

The seventh multiplexer 1251 may output one of the supply voltage VDDQ and the pull-up driving code UDCD in response to an output signal of the second OR gate 1257. For example, the seventh multiplexer 1251 may output the pull-up driving code UDCD when the output signal of the second OR gate 1257 is high, and output the supply voltage VDDQ, which is the pull-up turn off code UOFF, when the output signal of the second OR gate 1257 is low.

The fourth selection unit 1260 may include an eighth multiplexer 1261, the second AND gate 1252, the second inverter 1253, the third inverter 1254, the first OR gate 1255, the third AND gate 1256 and the second OR gate 1257. The fourth selection unit 1260 may share the second AND gate 1252, the second inverter 1253, the third inverter 1254, the first OR gate 1255, the third AND gate 1256 and the second OR gate 1257 with the third selection unit 1250.

The eighth multiplexer 1261 may output one of the ground voltage VSSQ and the pull-down driving code DDCD in response to the output signal of the second OR gate 1257. For example, the eighth multiplexer 1261 may output the ground voltage VSSQ, which is the pull-down turn off code DOFF, when the output signal of the second OR gate 1257 is high, and output the pull-down driving code DDCD when the output signal of the second OR gate 1257 is low.

The first selection unit 1210 and the second selection unit 1220 of FIG. 7 are equivalent to the third selection unit 1250 and the fourth selection unit 1260 of FIG. 8, respectively, since output signals of the first selection unit 1210 and the second selection unit 1220 of FIG. 7 are always the same as output signals of the third selection unit 1250 and the fourth selection unit 1260 of FIG. 8, respectively. Therefore, a detail description of operations of the third selection unit 1250 and the fourth selection unit 1260 will be omitted.

Figure 9:
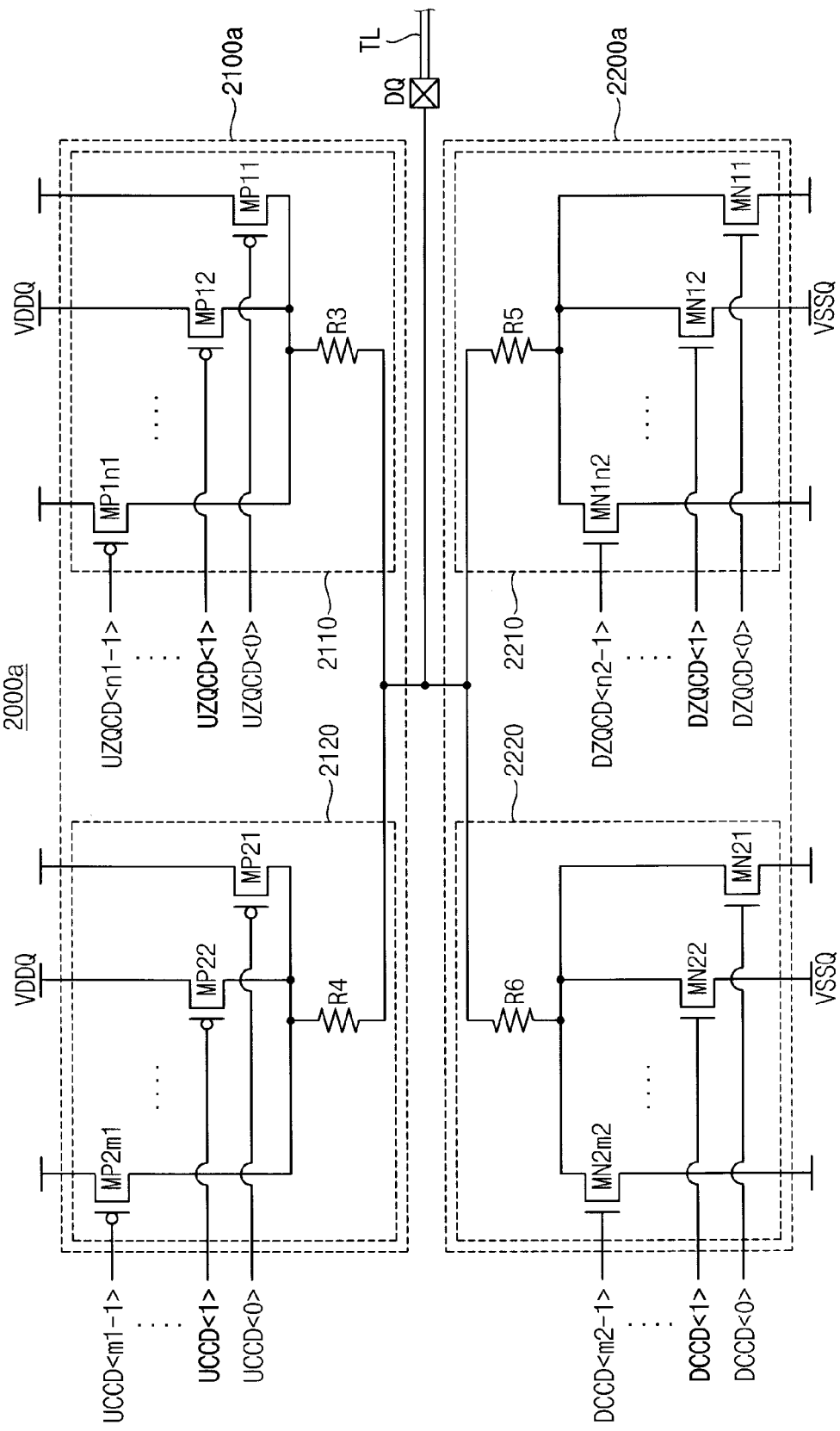
FIG. 9 is a block diagram further illustrating one possible example of a driving unit that might be incorporated within the data output buffer of FIG. 2.

FIG. 9 is a block diagram further illustrating one possible example of a driving unit that might be incorporated in the data output buffer of FIG. 2.

A driving unit 2000a of FIG. 9 may be used when the switching unit 1200 of FIG. 2 is embodied as the switching unit 1200a of FIG. 7 or the switching unit 1200b of FIG. 8.

Referring to FIG. 9, the driving unit 2000a comprises a pull-up driver 2100a and a pull-down driver 2200a. The pull-up driver 2100a may include a common pull-up resistor unit 2110 and a per-pin pull-up resistor unit 2120.

The common pull-up resistor unit 2110 may include a third resistor R3 coupled to the external pin DQ and a plurality of first PMOS transistors MP11, MP12, ..., MP1n1 coupled in parallel between the supply voltage VDDQ and the third resistor R3. A number of the plurality of the first PMOS transistors MP11, MP12, ..., MP1n1 may be the same as a number of bits included in the pull-up ZQ code UZQCD, which is n1. Each bit of the pull-up ZQ code UZQCD, which is included in the pull-up driving code UDCD, may be provided to each gate of the plurality of the first PMOS transistors MP11, MP12, ..., MP1n1, respectively. For example, as illustrated in FIG. 9, a most significant bit (MSB) of the pull-up ZQ code UZQCD, which is UZQCD<n1-1>, may be provided to the first PMOS transistor MP1n1, and a least significant bit (LSB) of the pull-up ZQ code UZQCD, which is UZQCD<0>, may be provided to the first PMOS transistor MP11.

The size the first PMOS transistor that receives an upper bit of the pull-up ZQ code UZQCD may be larger than the size of the first PMOS transistor that receives a lower bit of the pull-up ZQ code UZQCD. That is, the size of the first PMOS transistor MP1n1 receiving a MSB of the pull-up ZQ code UZQCD may be the largest among the plurality of the first PMOS transistors MP11, MP12, ..., MP1n1, and the size of the first PMOS transistor MP11 receiving a LSB of the pull-up ZQ code UZQCD may be the smallest among the plurality of the first PMOS transistors MP11, MP12, ..., MP1n1. Therefore, the first PMOS transistor that is controlled by an upper bit of the pull-up ZQ code UZQCD may drive a larger current than the first PMOS transistor that is controlled by a lower bit of the pull-up ZQ code UZQCD.

In the common pull-up resistor unit 2110 of FIG. 9, the third resistor R3 is commonly coupled between the external pin DQ and each of the plurality of the first PMOS transistors MP11, MP12, ..., MP1n1. In certain embodiments, each of resistors may be coupled between the external pin DQ and each of the plurality of the first PMOS transistors MP11, MP12, ..., MP1n1, respectively.

The per-pin pull-up resistor unit 2120 may include a fourth resistor R4 coupled to the external pin DQ and a plurality of second PMOS transistors MP21, MP22, ..., MP2m1 coupled in parallel between the supply voltage VDDQ and the fourth resistor R4. A number of the plurality of the second PMOS transistors MP21, MP22, ..., MP2m1 may be the same as a number of bits included in the pull-up calibration code UCCD, which is m1. Each bit of the pull-up calibration code UCCD, which is included in the pull-up driving code UDCD, may be provided to each gate of the plurality of the second PMOS transistors MP21, MP22, ..., MP2m1, respectively. For example, as illustrated in FIG. 9, a MSB of the pull-up calibration code UCCD, which is UCCD<m1-1>, may be provided to the second PMOS transistor MP2m1, and a LSB of the pull-up calibration code UCCD, which is UCCD<0>, may be provided to the second PMOS transistor MP21.

The size of the second PMOS transistor receiving an upper bit of the pull-up calibration code UCCD may be larger than the size of the second PMOS transistor receiving a lower bit of the pull-up calibration code UCCD. That is, the size of the second PMOS transistor MP2m1 receiving a MSB of the pull-up calibration code UCCD may be the largest among the plurality of the second PMOS transistors MP21, MP22, ..., MP2m1, and the size of the second PMOS transistor MP21 receiving a LSB of the pull-up calibration code UCCD may be the smallest among the plurality of the second PMOS transistors MP21, MP22, ..., MP2m1. Therefore, the second PMOS transistor that is controlled by an upper bit of the pull-up calibration code UCCD may drive a larger current than the second PMOS transistor that is controlled by a lower bit of the pull-up calibration code UCCD.

An initial impedance of the pull-up driver 2100a may be determined by the pull-up ZQ code UZQCD, and the impedance of the pull-up driver 2100a may be minutely adjusted by a change of the pull-up calibration code UCCD so that the impedance of the pull-up driver 2100a may be matched to the line impedance of the transmission line TL. Therefore, the respective sizes of the second PMOS transistors MP21, MP22, ..., MP2m1 may be smaller than sizes of the first PMOS transistors MP11, MP12, ..., MP1n1.

In the per-pin pull-up resistor unit 2120 of FIG. 9, the fourth resistor R4 is commonly coupled between the external pin DQ and each of the plurality of the second PMOS transistors MP21, MP22, ..., MP2m1. In certain embodiments, each of the resistors may be coupled between the external pin DQ and each of the plurality of the second PMOS transistors MP21, MP22, ..., MP2m1, respectively.

The pull-down driver 2200a may include a common pull-down resistor unit 2210 and a per-pin pull-down resistor unit 2220.

The common pull-down resistor unit 2210 may include a fifth resistor R5 coupled to the external pin DQ and a plurality of first NMOS transistors MN11, MN12, . . . , MN1n2 coupled in parallel between the ground voltage VSSQ and the fifth resistor R5. A number of the plurality of the first NMOS transistors MN11, MN12, . . . , MN1n2 may be the same as a number of bits included in the pull-down ZQ code DZQCD, which is n2. Each bit of the pull-down ZQ code DZQCD, which is included in the pull-down driving code DDCD, may be provided to each gate of the plurality of the first NMOS transistors MN11, MN12, . . . , MN1n2, respectively. For example, as illustrated in FIG. 9, a MSB of the pull-down ZQ code DZQCD, which is DZQCD<n2-1>, may be provided to the first NMOS transistor MN1n2, and a LSB of the pull-down ZQ code DZQCD, which is DZQCD<0>, may be provided to the first NMOS transistor MN11.

The size of the first NMOS transistor receiving an upper bit of the pull-down ZQ code DZQCD may be larger than a size of the first NMOS transistor receiving a lower bit of the pull-down ZQ code DZQCD. That is, the size of the first NMOS transistor MN1n2 receiving a MSB of the pull-down ZQ code DZQCD may be the largest among the plurality of the first NMOS transistors MN11, MN12, . . . , MN1n2, and the size of the first NMOS transistor MN11 receiving a LSB of the pull-down ZQ code DZQCD may be the smallest among the plurality of the first NMOS transistors MN11, MN12, . . . , MN1n2. Therefore, the first NMOS transistor that is controlled by an upper bit of the pull-down ZQ code DZQCD may drive a larger current than the first NMOS transistor that is controlled by a lower bit of the pull-down ZQ code DZQCD.

In the common pull-down resistor unit 2210 of FIG. 9, the fifth resistor R5 is commonly coupled between the external pin DQ and each of the plurality of the first NMOS transistors MN11, MN12, . . . , MN1n2. In certain embodiments, each of the resistors may be coupled between the external pin DQ and each of the plurality of the first NMOS transistors MN11, MN12, . . . , MN1n2, respectively.

The per-pin pull-down resistor unit 2220 may include a sixth resistor R6 coupled to the external pin DQ and a plurality of second NMOS transistors MN21, MN22, . . . , MN2m2 coupled in parallel between the ground voltage VSSQ and the sixth resistor R6. A number of the plurality of the second NMOS transistors MN21, MN22, . . . , MN2m2 may be the same as a number of bits included in the pull-down calibration code DCCD, which is m2. Each bit of the pull-down calibration code DCCD, which is included in the pull-down driving code DDCD, may be provided to each gate of the plurality of the second NMOS transistors MN21, MN22, . . . , MN2m2, respectively. For example, as illustrated in FIG. 9, a MSB of the pull-down calibration code DCCD, which is DCCD<m2-1>, may be provided to the second NMOS transistor MN2m2, and a LSB of the pull-down calibration code DCCD, which is DCCD<0>, may be provided to the second NMOS transistor MN21.

The size of the second NMOS transistor receiving an upper bit of the pull-down calibration code DCCD may be larger than the size of the second NMOS transistor receiving a lower bit of the pull-down calibration code DCCD. That is, the size of the second NMOS transistor MN2m2 receiving a MSB of the pull-down calibration code DCCD may be the largest among the plurality of the second NMOS transistors MN21, MN22, . . . , MN2m2, and the size of the second NMOS transistor MN21 receiving a LSB of the pull-down calibration code DCCD may be the smallest among the plurality of the second NMOS transistors MN21, MN22, . . . , MN2m2. Therefore, the second NMOS transistor that is controlled by an upper bit of the pull-down calibration code DCCD may drive a larger current than the second NMOS transistor that is controlled by a lower bit of the pull-down calibration code DCCD.

An initial impedance of the pull-down driver 2200a may be determined by the pull-down ZQ code DZQCD, and the impedance of the pull-down driver 2200a may be minutely adjusted by a change of the pull-down calibration code DCCD so that the impedance of the pull-down driver 2200a may be matched to the impedance of the transmission line TL. Therefore, sizes of the second NMOS transistors MN21, MN22, . . . , MN2m2 may be smaller than sizes of the first NMOS transistors MN11, MN12, . . . , MN1n2.

In the per-pin pull-down resistor unit 2220 of FIG. 9, the sixth resistor R6 is commonly coupled between the external pin DQ and each of the plurality of the second NMOS transistors MN21, MN22, . . . , MN2m2. In certain embodiments, each of resistors may be coupled between the external pin DQ and each of the plurality of the second NMOS transistors MN21, MN22, . . . , MN2m2, respectively.

Figure 10:
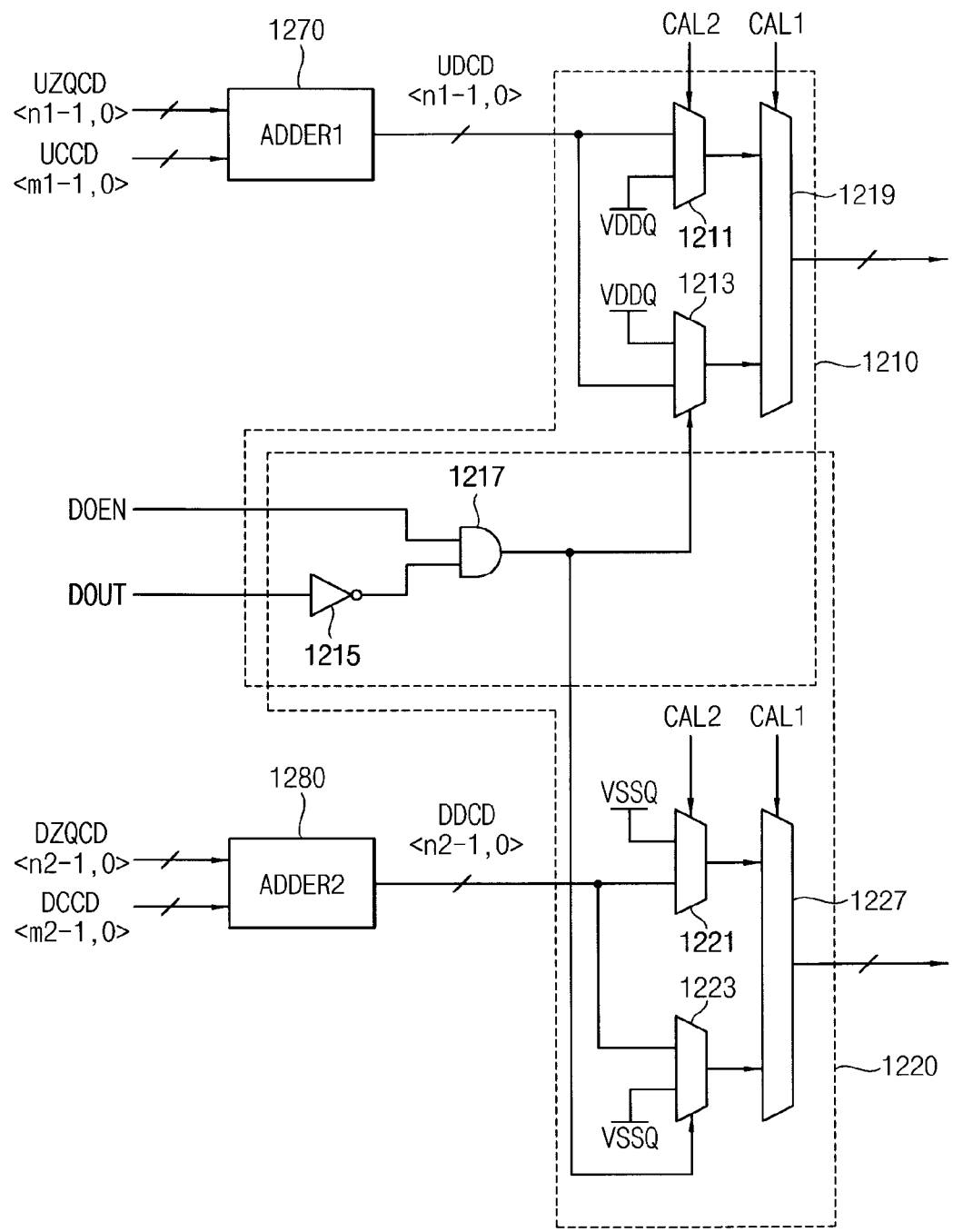
FIG. 10 is a block diagram further illustrating another possible example of a switching unit that might be incorporated within the data output buffer of FIG. 2.

FIG. 10 is a block diagram illustrating still another possible example of a switching unit that might be incorporated in the data output buffer of FIG. 2. Referring to FIG. 10, a switching unit 1200c comprises a first adder 1270, a second adder 1280, the first selection unit 1210 and the second selection unit 1220.

In FIG. 10, the pull-up ZQ code UZQCD has n1-bits, the pull-down ZQ code DZQCD has n2-bits, the pull-up calibration code UCCD has m1-bits and the pull-down calibration code DCCD has m2-bits.

As described above, a number of bits of the pull-up calibration code UCCD, which is m1, may be less than a number of bits of the pull-up ZQ code UZQCD, which is n1. A number of bits of the pull-down calibration code DCCD, which is m2, may be less than a number of bits of the pull-down ZQ code DZQCD, which is n2.

The first adder 1270 may generate the pull-up driving code UDCD by adding the pull-up calibration code UCCD and pull-up ZQ code UZQCD. For example, the first adder 1270 may generate the pull-up driving code UDCD having n1-bits by adding m1-bits of the pull-up calibration code UCCD and n1-bits of the pull-up ZQ code UZQCD.

The second adder 1280 may generate the pull-down driving code DDCD by adding the pull-down calibration code DCCD and pull-down ZQ code DZQCD. For example, the second adder 1280 may generate the pull-down driving code DDCD having n2-bits by adding m2-bits of the pull-down calibration code DCCD and n2-bits of the pull-down ZQ code DZQCD.

The first selection unit 1210 and the second selection unit 1220 included in the switching unit 1200c of FIG. 10 may have the same structure and operation as the first selection unit 1210 and the second selection unit 1220 included in the switching unit 1200a of FIG. 7. Therefore, a detail description of the first selection unit 1210 and the second selection unit 1220 included in the switching unit 1200c of FIG. 10 will be omitted.

Figure 11:
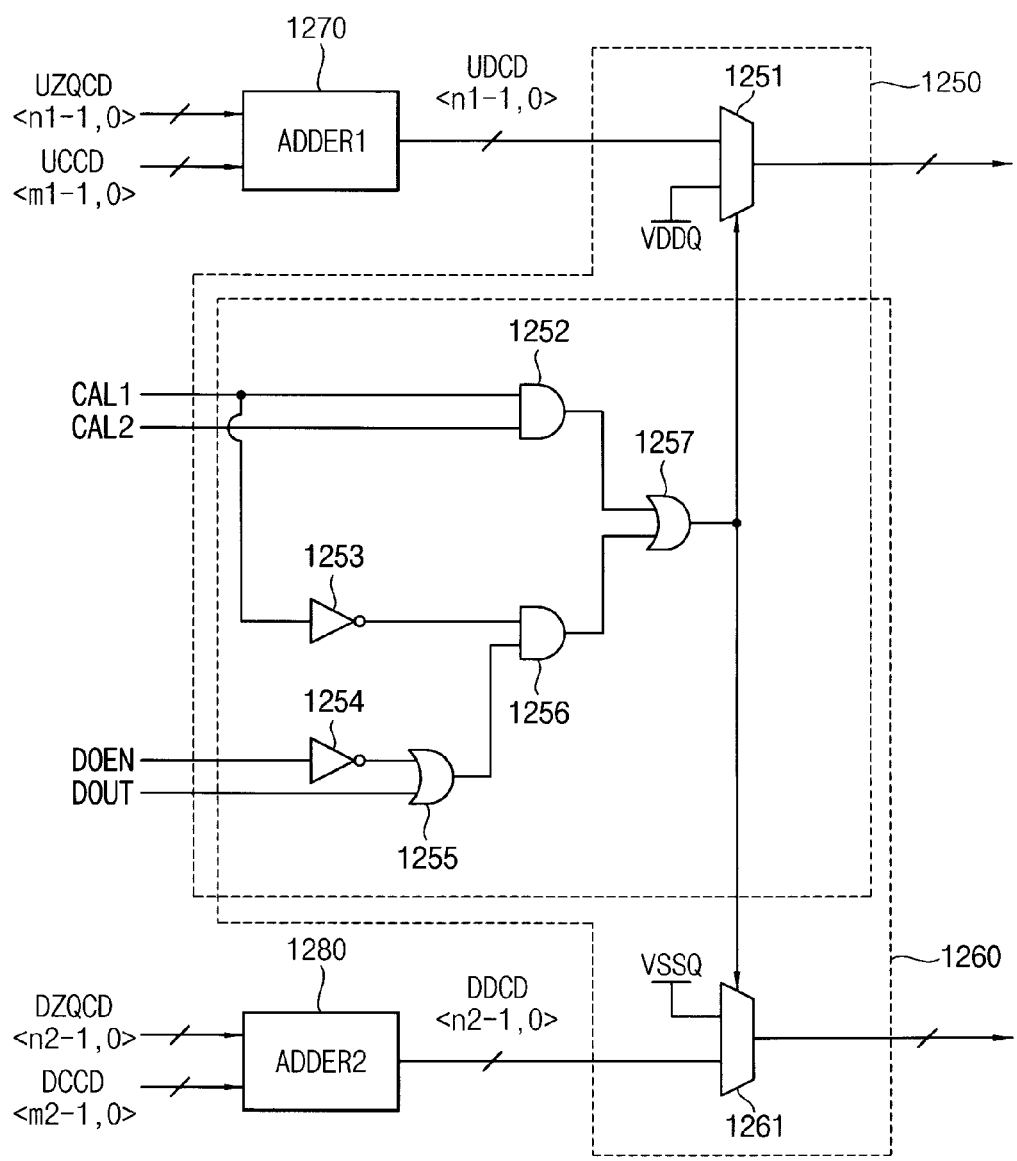
FIG. 11 is a block diagram further illustrating another possible example of a switching unit that might be incorporated within the data output buffer of FIG. 2.

FIG. 11 is a block diagram illustrating still another possible example of a switching unit that might be incorporated in the data output buffer of FIG. 2. Referring to FIG. 11, a switching unit 1200d comprises the first adder 1270, the second adder 1280, the third selection unit 1250 and the fourth selection unit 1260.

The first adder 1270 and the second adder 1280 included in the switching unit 1200*d* of FIG. 11 may have the same structure and operation as the first adder 1270 and the second adder 1280 included in the switching unit 1200*c* of FIG. 10. The third selection unit 1250 and the fourth selection unit 1260 included in the switching unit 1200*d* of FIG. 11 may have the same structure and operation as the third selection unit 1250 and the fourth selection unit 1260 included in the switching unit 1200*b* of FIG. 8. Therefore, a detail description of the switching unit 1200*d* will be omitted.

Figure 12:
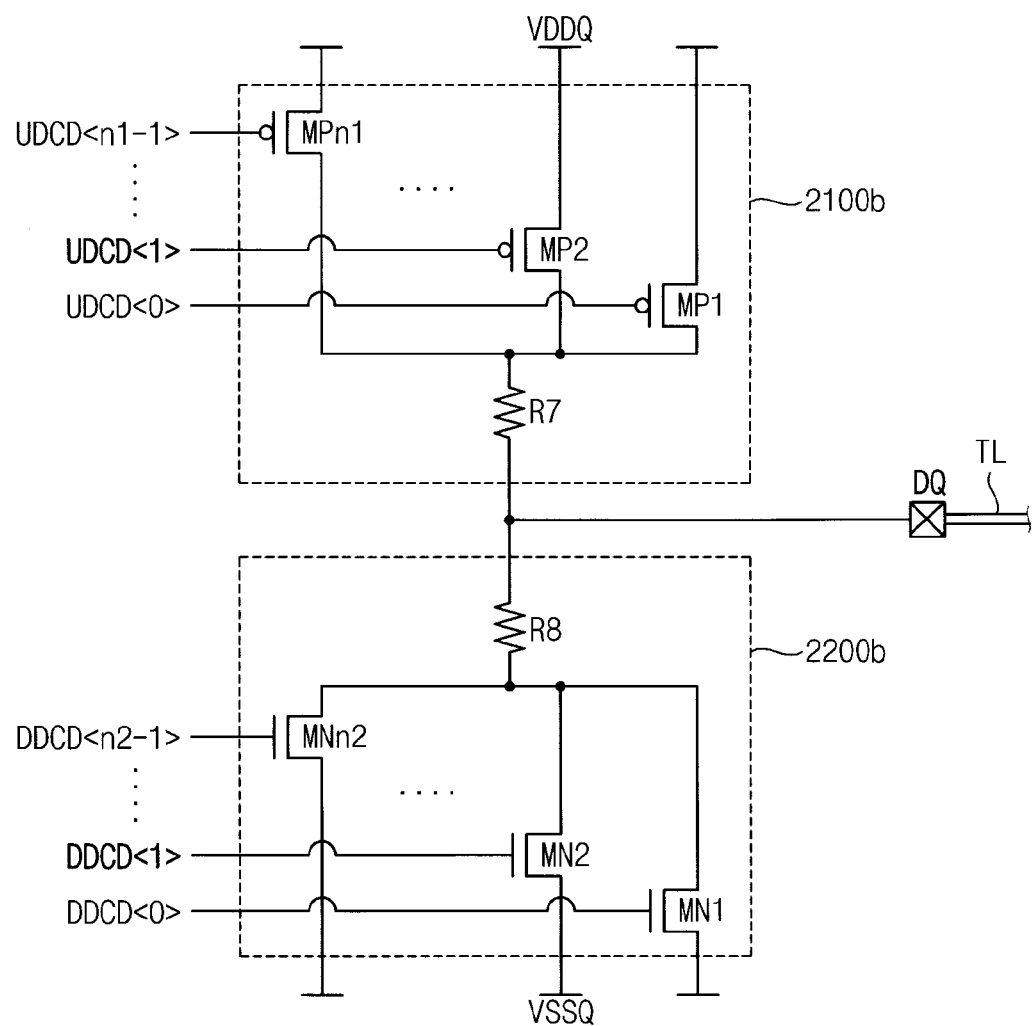
FIG. 12 is a block diagram further illustrating another possible example of a driving unit that might be incorporated within the data output buffer of FIG. 2.

FIG. 12 is a block diagram illustrating another possible example of a driving unit that might be incorporated in the data output buffer of FIG. 2. The driving unit 2000*b* of FIG. 12 may be used when the switching unit 1200 of FIG. 2 is embodied by the switching unit 1200*c* of FIG. 10 or the switching unit 1200*d* of FIG. 11.

Referring to FIG. 12, the driving unit 2000*b* comprises a pull-up driver 2100*b* and a pull-down driver 2200*b*.

The pull-up driver 2100*b* may include a seventh resistor R7 coupled to the external pin DQ and a plurality of third PMOS transistors MP1, MP2, . . . , MPn1 coupled in parallel between the supply voltage VDDQ and the seventh resistor R7. A number of the plurality of the third PMOS transistors MP1, MP2, . . . , MPn1 may be the same as a number of bits included in the pull-up driving code UDCD, which is n1. Each bit of the pull-up driving code UDCD may be provided to each gate of the plurality of the third PMOS transistors MP1, MP2, . . . , MPn1, respectively. For example, as illustrated in FIG. 12, a MSB of the pull-up driving code UDCD, which is UDCD<n1-1>, may be provided to the third PMOS transistor MPn1, and a LSB of the pull-up driving code UDCD, which is UDCD<0>, may be provided to the third PMOS transistor MP1.

The size of the third PMOS transistor receiving an upper bit of the pull-up driving code UDCD may be larger than the size of the third PMOS transistor receiving a lower bit of the pull-up driving code UDCD. That is, the size of the third PMOS transistor MPn1 receiving a MSB of the pull-up driving code UDCD may be the largest among the plurality of the third PMOS transistors MP1, MP2, . . . , MPn1, and the size of the third PMOS transistor MP1 receiving a LSB of the pull-up driving code UDCD may be the smallest among the plurality of the third PMOS transistors MP1, MP2, . . . , MPn1. Therefore, the third PMOS transistor that is controlled by an upper bit of the pull-up driving code UDCD may drive a larger current than the third PMOS transistor that is controlled by a lower bit of the pull-up driving code UDCD.

In the pull-up driver 2100*b* of FIG. 12, the seventh resistor R7 is commonly coupled between the external pin DQ and each of the plurality of the third PMOS transistors MP1, MP2, . . . , MPn1. In some other embodiments, each of resistors may be coupled between the external pin DQ and each of the plurality of the third PMOS transistors MP1, MP2, . . . , MPn1, respectively.

The pull-down driver 2200*b* may include an eighth resistor R8 coupled to the external pin DQ and a plurality of third NMOS transistors MN1, MN2, . . . , MNn2 coupled in parallel between the ground voltage VSSQ and the eighth resistor R8. A number of the plurality of the third NMOS transistors MN1, MN2, . . . , MNn2 may be the same as a number of bits included in the pull-down driving code DDCD, which is n2. Each bit of the pull-down driving code DDCD may be provided to each gate of the plurality of the third NMOS transistors MN1, MN2, . . . , MNn2, respectively. For example, as illustrated in FIG. 12, a MSB of the pull-down driving code DDCD, which is DDCD<n2-1>, may be provided to the third NMOS transistor MNn2, and a LSB of the pull-down driving code DDCD, which is DDCD<0>, may be provided to the third NMOS transistor MN1.

The size of the third NMOS transistor receiving an upper bit of the pull-down driving code DDCD may be larger than the size of the third NMOS transistor receiving a lower bit of the pull-down driving code DDCD. That is, the size of the third NMOS transistor MNn2 receiving a MSB of the pull-down driving code DDCD may be the largest among the plurality of the third NMOS transistors MN1, MN2, . . . , MNn2, and the size of the third NMOS transistor MN1 receiving a LSB of the pull-down driving code DDCD may be the smallest among the plurality of the third NMOS transistors MN1, MN2, . . . , MNn2. Therefore, the third NMOS transistor that is controlled by an upper bit of the pull-down driving code DDCD may drive a larger current than the third NMOS transistor that is controlled by a lower bit of the pull-down driving code DDCD.

In the pull-down driver 2200*b* of FIG. 12, the eighth resistor R8 is commonly coupled between the external pin DQ and each of the plurality of the third NMOS transistors MN1, MN2, . . . , MNn2. In some other embodiments, each of resistors may be coupled between the external pin DQ and each of the plurality of the third NMOS transistors MN1, MN2, . . . , MNn2, respectively.

Figure 13:
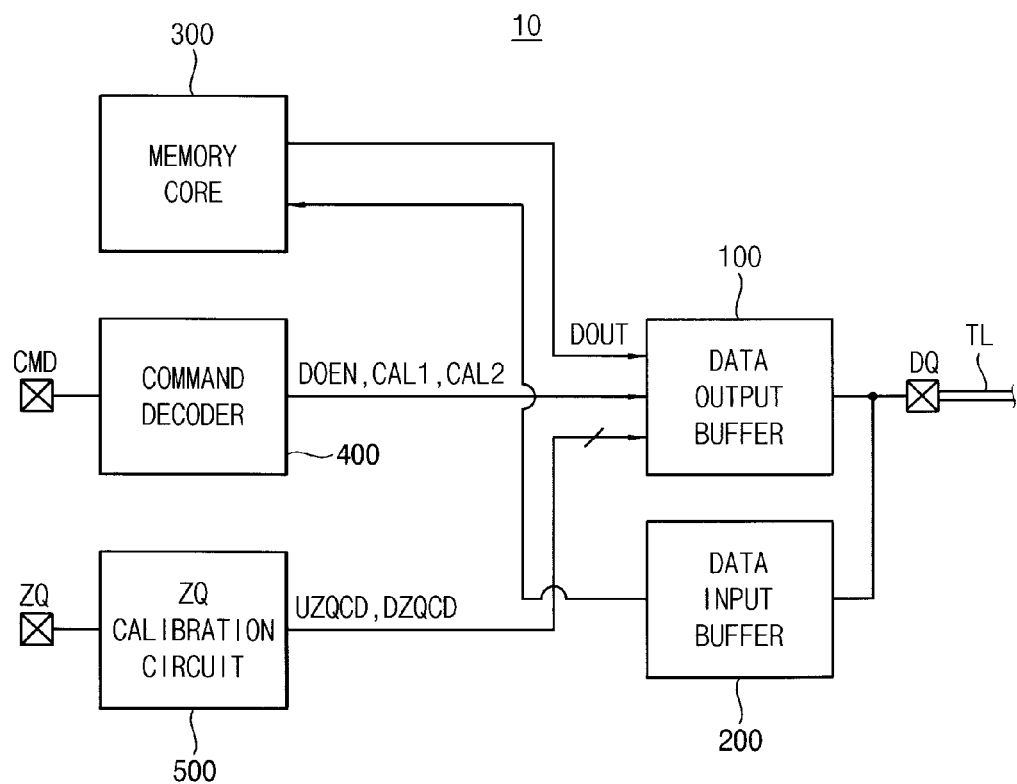
FIG. 13 is a block diagram illustrating another memory device according to an embodiment of the inventive concept.

FIG. 13 is a block diagram illustrating a memory device according to embodiment of the inventive concept. FIG. 14 is a general block diagram illustrating a memory system according an certain embodiments of the inventive concept.

Figure 14:
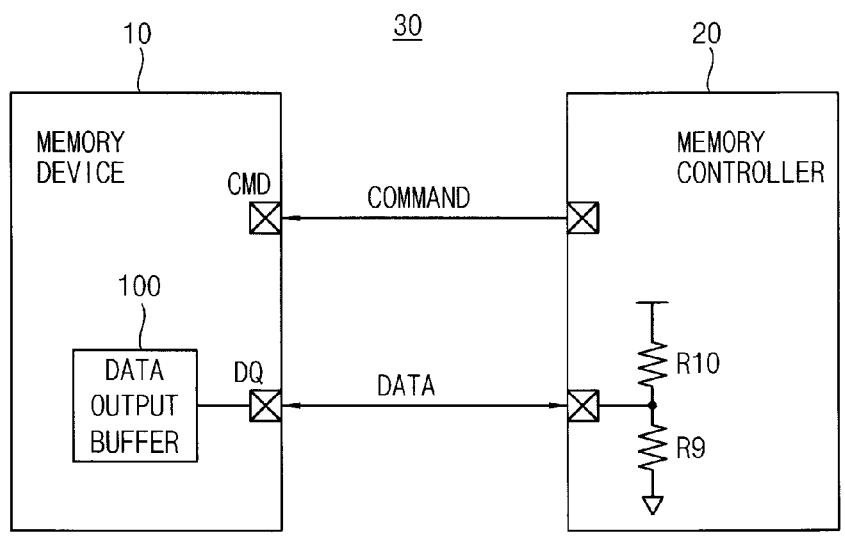
FIG. 14 is a block diagram illustrating a memory system incorporating a memory device according to an embodiment of the inventive concept.

Referring to FIGS. 13 and 14, a memory system 30 includes a memory device 10 and a memory controller 20. The memory device 10 includes a memory core 300, a data output buffer 100, a data input buffer 200, a command decoder 400 and a ZQ calibration circuit 500.

The memory controller 20 controls the memory device 10 using a command signal COMMAND. The memory controller 20 transmits write data (DATA) to the memory device 10 during the write mode, and receives read data (DATA) from the memory device 10 during the read mode.

The command decoder 400 generates the output enable signal DOEN, the first calibration signal CAL1 and the second calibration signal CAL2 by decoding the command signal COMMAND received from the memory controller 20 through a command pin CMD.

The data input buffer 200 is coupled to the external pin DQ. The external pin DQ may be data input/output pin. The data input buffer 200 receives a write data from the memory controller 20 through the external pin DQ, and provides the write data to the memory core 300.

The memory core 300 stores the write data received from the data input buffer 200 and provides the stored data as the read data DOUT to the data output buffer 100.

The data output buffer 100 is coupled to the external pin DQ. The data output buffer 100 selectively performs one of the termination operation, in which the data output buffer 100 presents the termination impedance to the transmission line TL coupled to the external pin DQ, or the driving operation, in which the data output buffer 100 presents the drive impedance to the transmission line TL while outputting the read data to the memory controller 20 through the transmission line TL.

The memory device 10 may include a plurality of external pins DQ, a plurality of data input buffers 200 and a plurality of data output buffers 100.

The ZQ calibration circuit 500 is coupled to a ZQ pin ZQ. The ZQ calibration circuit 500 provides the pull-up ZQ code UZQCD and the pull-down ZQ code DZQCD to the plurality of the data output buffers 100.

Each of the plurality of the data output buffers 100, which is coupled to each of the plurality of the external pins DQ, determines initial values of the termination impedance and the drive impedance based on the pull-up ZQ code UZQCD and the pull-down ZQ code DZQCD that is commonly received from the ZQ calibration circuit 500. Each of the plurality of the data output buffers 100 minutely adjusts values of the termination impedance and the drive impedance based on the voltage of each of the plurality of the external pins DQ while the memory device 10 is coupled to the memory controller 20 so that the termination impedance and the drive impedance are matched to the impedance of the transmission line TL.

Each of the plurality of the data output buffers 100 may include a pull-up driver and a pull-down driver, and adjust the values of the termination impedance and the drive impedance by determining values of impedances of the pull-up driver and the pull-down driver.

To determine the value of the impedance of the pull-up driver, the memory controller 20 may operate in a pull-down mode, and the data output buffer 100 may adjust the impedance of the pull-up driver while turning off the pull-down driver so that the voltage of the external pin DQ equals to a first reference voltage. The level of the first reference voltage may be determined based on a ratio between a target impedance of the pull-up driver and a pull-down resistor R9 of the memory controller 20.

To determine the value of the impedance of the pull-down driver, the memory controller 20 may operate in a pull-up mode, and the data output buffer 100 may adjust the impedance of the pull-down driver while turning off the pull-up driver so that the voltage of the external pin DQ equals to a second reference voltage. The level of the second reference voltage may be determined based on a ratio between a target impedance of the pull-down driver and a pull-up resistor R10 of the memory controller 20.

As described above, each of the plurality of the data output buffers 100 may adjust the termination impedance and the drive impedance in response to an output voltage at a corresponding external pin DQ. Therefore, each of the plurality of the data output buffers 100 may provide a termination impedance and drive impedance that exactly match the impedance of the transmission line TL coupled to the corresponding external pin DQ.

The memory controller 20 may provide the first calibration signal CAL1 and the second calibration signal CAL2 to the memory device 10 periodically or non-periodically so that the data output buffer 100 may adjust the values of the termination impedance and the drive impedance. Therefore, the termination impedance and drive impedance may be exactly matched to the impedance of the transmission line TL regardless of changes in memory system operating conditions, such as a temperature, a humidity, etc.

The data output buffer 100 included in the memory device 10 of FIG. 13 may have the same structure and operation as the data output buffer of FIG. 1. Therefore, a detail description of the data output buffer 100 included in the memory device 10 of FIG. 13 will be omitted.

Figure 15:
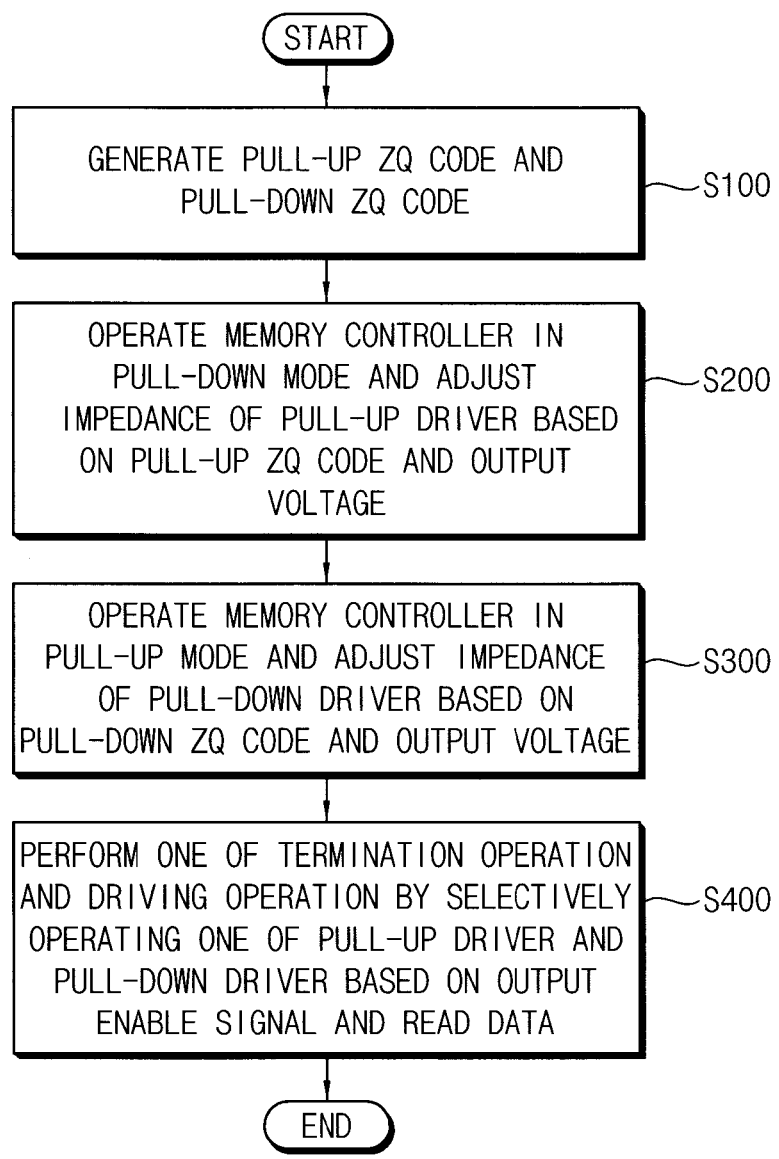
FIG. 15 is a flow chart summarizing a method of operating the memory system of FIG. 14.

FIG. 15 is a flow chart summarizing a method of operating a memory system, like the memory system described with reference to FIG. 14.

Referring to FIGS. 1 to 15, the pull-up ZQ code UZQCD and the pull-down ZQ code DZQCD may be generated by the ZQ calibration circuit 500 included in the memory device 10 (S100).

During the termination mode, the impedance of the pull-up driver 2100 that is included in the memory device 10 may be adjusted based on the pull-up ZQ code UZQCD and the voltage of the external pin DQ while the memory controller 20 operates in the pull-down mode, in which the memory controller 20 connects the pull-down resistor R9 between the ground voltage and the transmission line TL coupled to the external pin DQ of the memory device 10 (S200).

During the termination mode, the impedance of the pull-down driver 2200 that is included in the memory device 10 may be adjusted based on the pull-down ZQ code DZQCD and the voltage of the external pin DQ while the memory controller 20 operates in the pull-up mode, in which the memory controller 20 connects the pull-up resistor R10 between the supply voltage and the transmission line TL coupled to the external pin DQ of the memory device 10 (S300).

In the example memory system assumed in FIG. 15, step S300 is performed after step S200. However, in other memory systems, step S200 may be performed after step S300.

Finally, either the termination operation or the driving operation is performed by selectively operating one of the pull-up driver 2100 and the pull-down driver 2200 based on the output enable signal DOEN and the read data DOUT (S400).

Figure 16:
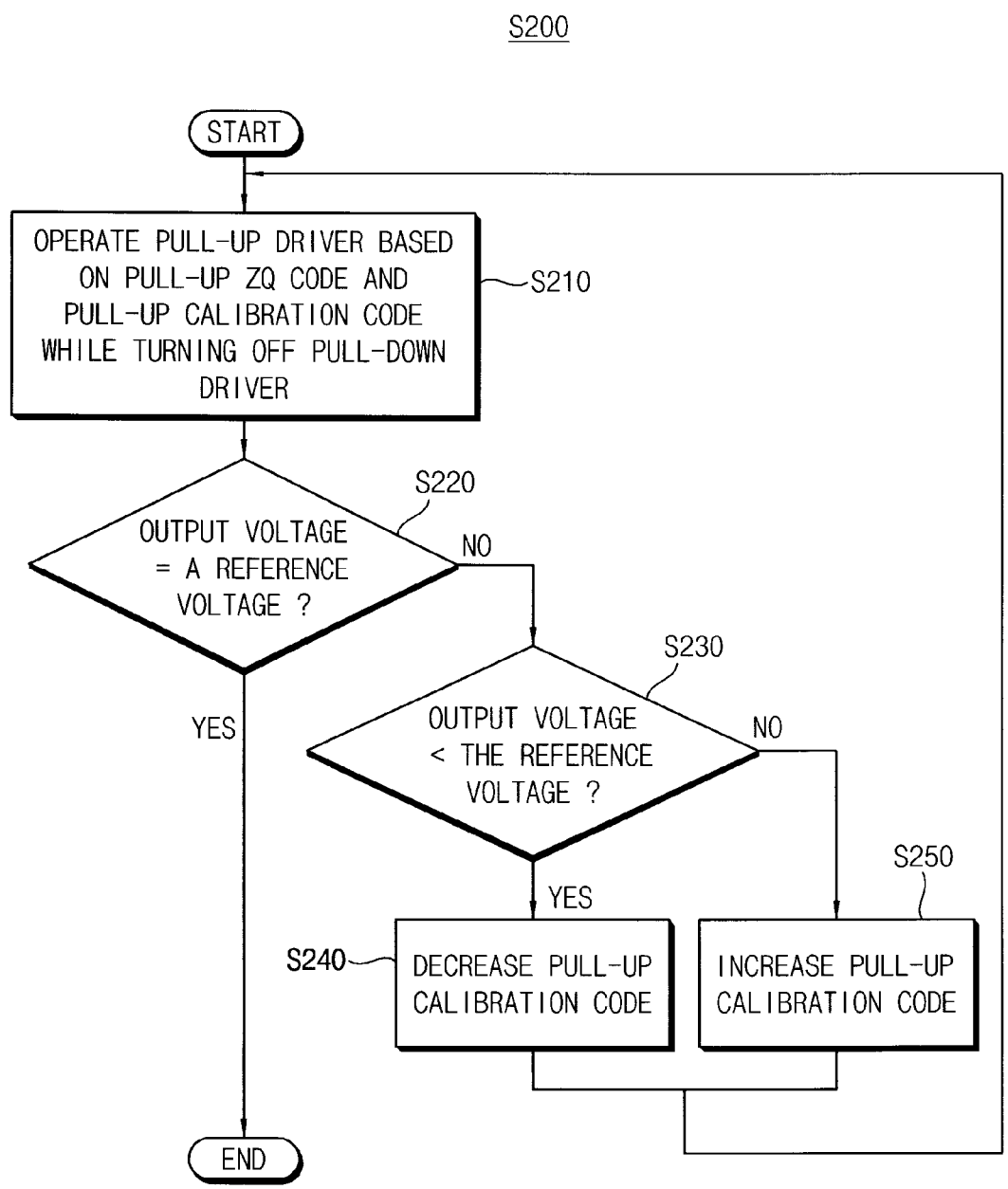
FIG. 16 is a flow chart for describing the step of adjusting the impedance of a pull-up driver in the operating method of FIG. 15.

FIG. 16 is a flow chart further describing the step of adjusting the impedance of the pull-up driver within the operating method of FIG. 15.

Referring to FIG. 16, when the control unit 1000 included in the data output buffer 100 receives a high first calibration signal CAL1 and a high second calibration signal CAL2, the control unit 1000 provides the pull-up driving code UDCD, which is generated using the pull-up ZQ code UZQCD and the pull-up calibration code UCCD, to the pull-up driver 2100 and provide the ground voltage VSSQ, which is the pull-down turn off code DOFF, to the pull-down driver 2200, so that the pull-up driver 2100 operates based on the pull-up ZQ code UZQCD and the pull-up calibration code UCCD, and the pull-down driver 2200 is turned off (S210).

The pull-up calibration code UCCD may be counted up or counted down based on a difference between the output voltage at the external pin DQ and the reference voltage VREF. Therefore, an initial value of the pull-up calibration code UCCD may be set to have 1 as a MSB and to have 0 as other bits so that the pull-up calibration code UCCD may have the same offset between a counting up direction and a counting down direction.

The control unit 1000 may determine whether the output voltage at the external pin DQ equals to the reference voltage VREF while operating the pull-up driver 2100 based on the pull-up ZQ code UZQCD and the pull-up calibration code UCCD (S220).

When the output voltage at the external pin DQ equals to the reference voltage VREF, the step of adjusting the impedance of the pull-up driver 2100 (S200) is completed.

When the voltage of the external pin DQ is less than the reference voltage VREF (S230), the control unit 1000 may count-down the pull-up calibration code UCCD by one (S240). After that, step S210 and step S220 may be repeated. When the pull-up calibration code UCCD decreases, the impedance of the pull-up driver 2100 may decrease and the voltage of the external pin DQ may increase.

When the voltage of the external pin DQ is greater than the reference voltage VREF (S230), the control unit 1000 may count-up the pull-up calibration code UCCD by one (S250). After that, step S210 and step S220 may be repeated. When the pull-up calibration code UCCD increases, the impedance of the pull-up driver 2100 may increase and the voltage of the external pin DQ may decrease.

FIG. 17 is a flow chart further describing the step of adjusting the impedance of a pull-down driver within the operating method of FIG. 15.

Referring to FIG. 17, when the control unit 1000 included in the data output buffer 100 receives a high first calibration signal CAL1 and a low second calibration signal CAL2, the control unit 1000 may provide the pull-down driving code DDCD, which is generated using the pull-down ZQ code DZQCD and the pull-down calibration code DCCD, to the pull-down driver 2200 and provide the supply voltage VDDQ, which is the pull-up turn off code UOFF, to the pull-up driver 2100, so that the pull-down driver 2200 operates based on the pull-down ZQ code DZQCD and the pull-down calibration code DCCD, and the pull-up driver 2100 is turned off (S310).

The pull-down calibration code DCCD may be counted up or counted down based on a difference between the voltage of the external pin DQ and the reference voltage VREF. Therefore, an initial value of the pull-down calibration code DCCD may be set to have 1 as a MSB and to have 0 as other bits so that the pull-down calibration code DCCD may have the same offset between a counting up direction and a counting down direction.

The control unit 1000 may determine whether the voltage of the external pin DQ equals to the reference voltage VREF while operating the pull-down driver 2200 based on the pull-down ZQ code DZQCD and the pull-down calibration code DCCD (S320).

When the output voltage at the external pin DQ equals to the reference voltage VREF, the step of adjusting the impedance of the pull-down driver 2200 (S300) is completed.

When the output voltage at the external pin DQ is less than the reference voltage VREF (S330), the control unit 1000 may count-down the pull-down calibration code DCCD by one (S340). After that, step S310 and step S320 may be repeated. When the pull-down calibration code DCCD decreases, the impedance of the pull-down driver 2200 may increase and the voltage of the external pin DQ may increase.

When the voltage of the external pin DQ is greater than the reference voltage VREF (S330), the control unit 1000 may count-up the pull-down calibration code DCCD by one (S350). After that, step S310 and step S320 may be repeated. When the pull-down calibration code DCCD increases, the impedance of the pull-down driver 2200 may decrease and the voltage of the external pin DQ may decrease.

As described above, since data output buffer 100 of FIG. 1, as an example of similar data buffers consistent with the inventive concept, adjusts the termination impedance and the drive impedance based on an output voltage at a corresponding external pin DQ, the data output buffer 100 may provide a termination impedance and drive impedance that exactly match to the impedance of the transmission line TL coupled to the external pin DQ.

The above-disclosed subject matter is to be considered illustrative, and not restrictive, and the appended claims are intended to cover modifications, enhancements, and other embodiments that within their scope. Thus, to the maximum extent allowed by law, the scope of the claims is to be determined by the broadest permissible interpretation of the following claims and their equivalents, and shall not be restricted or limited to only the foregoing detailed description.

What is claimed is:

1. A data output buffer of a memory device, comprising:
an external pin coupled to a transmission line;
a driving unit coupled to the external pin and configured to selectively perform a termination operation that presents a termination impedance to the transmission line via the external pin and a driving operation that presents a drive impedance to the transmission line while read data is output to the transmission line via the external pin, wherein the driving unit comprises;
 a pull-up driver coupled between a supply voltage and the external pin, and having a pull-up driver impedance that varies with a pull-up driving code; and
 a pull-down driver coupled between the external pin and a ground voltage, and having a pull-down driver impedance that varies with a pull-down driving code;
a control unit configured to adjust a value of the termination impedance and a value of the drive impedance based on an output voltage apparent at the external pin during a termination mode of operation for the memory device, and to control the driving unit to selectively perform either the termination operation or the driving operation;
a calibration unit configured to respectively generate a pull-up calibration code and a pull-down calibration code by comparing the output voltage with a reference voltage in response to a first calibration signal and a second calibration signal; and
a switching unit configured to generate the pull-up driving code and the pull-down driving code based on the pull-up calibration code, the pull-down calibration code, a pull-up ZQ code and a pull-down ZQ code.

2. The data output buffer of claim 1, wherein the control unit is further configured to generate the pull-up driving code and the pull-down driving code by comparing the output voltage with the reference voltage during the termination mode, such that the pull-up driving code is provided to the pull-up driver while the pull-down driver is turned off, or the pull-down driving code is provided to the pull-down driver while the pull-up driver is turned off during the driving mode.

3. The data output buffer of claim 1, wherein the
switching unit is further configured to provide the pull-up driving code to the pull-up driver while turning off the pull-down driver, or provide the pull-down driving code to the pull-down driver while turning off the pull-up driver in response to an output enable signal, the read data, the first calibration signal and the second calibration signal.

4. The data output buffer of claim 3, wherein the calibration unit comprises:
a clock generator configured to generate a clock signal while the first calibration signal is enabled;
a comparator configured to generate a comparison signal by comparing the output voltage at the external pin with the reference voltage;
a counting unit configured to generate a counting value by performing a count-up operation or a count-down operation in response to the clock signal and the comparison signal;
a first register configured to store the counting value and provide a stored counting value as the pull-up calibration code; and
a second register configured to store the counting value and provide a stored counting value as the pull-down calibration code.

5. The data output buffer of claim 4, wherein the counting unit comprises:

a counter configured to generate the counting value by performing a count-up operation or a count-down operation synchronously with the clock signal based on a logic level of the comparison signal, the counter being configured to reset the counting value when the first calibration signal is enabled; and a de-multiplexer configured to selectively provide the counting value to one of the first register and the second register in response to the second calibration signal.

6. The data output buffer of claim 4, wherein the calibration unit further comprises:

a reference voltage generator that generates the reference voltage, the reference voltage generator including a first resistor coupled between the supply voltage and a first node and a second resistor coupled between the first node and the ground voltage, the reference voltage generator being configured to output the reference voltage at the first node.

7. The data output buffer of claim 3, wherein the switching unit is further configured to provide the pull-up driving code to the pull-up driver while turning off the pull-down driver or provides the pull-down driving code to the pull-down driver while turning off the pull-up driver in response to a logic level of the second calibration signal during the termination mode, and to provide the pull-up driving code to the pull-up driver while turning off the pull-down driver or provides the pull-down driving code to the pull-down driver while turning off the pull-up driver in response to a result of an AND operation between the output enable signal and an inverted version of the read data during the driving mode.

8. The data output buffer of claim 3, wherein the switching unit comprises:

a first selection unit configured to provide a pull-up turn off code that turns off the pull-up driver, or the pull-up driving code to the pull-up driver in response to the output enable signal, the read data, the first calibration signal and the second calibration signal; and a second selection unit configured to provide a pull-down turn off code that turns off the pull-down driver, or the pull-down driving code to the pull-down driver in response to the output enable signal, the read data, the first calibration signal and the second calibration signal.

9. The data output buffer of claim 8,
wherein the first selection unit comprises:

a first multiplexer configured to output one of the supply voltage and the pull-up driving code in response to the second calibration signal;

a second multiplexer configured to output one of the supply voltage and the pull-up driving code in response to a result of an AND operation between the output enable signal and an inverted version of the read data; and a third multiplexer configured to provide one of an output signal of the first multiplexer and an output signal of the second multiplexer to the pull-up driver in response to the first calibration signal, and the second selection unit comprises:

a fourth multiplexer configured to output one of the ground voltage and the pull-down driving code in response to the second calibration signal;

a fifth multiplexer configured to output one of the ground voltage and the pull-down driving code in response to the result of an AND operation between the output enable signal and the inverted version of the read data; and a sixth multiplexer configured to provide one of an output signal of the fourth multiplexer and an output signal of the fifth multiplexer to the pull-down driver in response to the first calibration signal.

10. The data output buffer of claim 8, wherein the switching unit further comprises:

a first combine unit configured to generate the pull-up driving code by combining bits of the pull-up calibration code to the end of bits of the pull-up ZQ code; and a second combine unit configured to generate the pull-down driving code by combining bits of the pull-down calibration code to the end of bits of the pull-down ZQ code.

11. The data output buffer of claim 10, wherein the pull-up driver comprises:

a common pull-up resistor unit including a first resistor coupled to the external pin and a plurality of first p-type metal oxide semiconductor (PMOS) transistors coupled in parallel between the supply voltage and the first resistor; and a per-pin pull-up resistor unit including a second resistor coupled to the external pin and a plurality of second PMOS transistors coupled in parallel between the supply voltage and the second resistor, and wherein each bit of the pull-up ZQ code included in the pull-up driving code is respectively provided to the gate of one of the plurality of the first PMOS transistors, and each bit of the pull-up calibration code included in the pull-up driving code is respectively provided to the gate of the plurality of the second PMOS transistors.

12. The data output buffer of claim 10, wherein the pull-down driver comprises:

a common pull-down resistor unit including a first resistor coupled to the external pin and a plurality of first n-type metal oxide semiconductor (NMOS) transistors coupled in parallel between the ground voltage and the first resistor; and a per-pin pull-down resistor unit including a second resistor coupled to the external pin and a plurality of second NMOS transistors coupled in parallel between the ground voltage and the second resistor, and wherein each bit of the pull-down ZQ code included in the pull-down driving code is respectively provided to the gate of one of the plurality of the first NMOS transistors, and each bit of the pull-down calibration code included in the pull-down driving code is respectively provided to the gate of the plurality of the second NMOS transistors.

13. The data output buffer of claim 8, wherein the switching unit further comprises:

a first adder configured to generate the pull-up driving code by adding the pull-up calibration code and the pull-up ZQ code; and a second adder configured to generate the pull-down driving code by adding the pull-down calibration code and the pull-down ZQ code.

14. The data output buffer of claim 13, wherein the pull-up driver comprises a first resistor coupled to the external pin and a plurality of PMOS transistors coupled in parallel between the supply voltage and the first resistor, the pull-down driver comprises a second resistor coupled to the external pin and a plurality of NMOS transistors coupled in parallel between the ground voltage and the second resistor, and each bit of the pull-up driving code is respectively provided to each gate of the plurality of PMOS transistors, and each bit of the pull-down driving code is respectively provided to each gate of the plurality of NMOS transistors.

15. A method of operating a data output buffer of a memory device, the memory device being capable of operating in a write mode during which externally provided data is provided to an external pin via a transmission line and in a read mode during which read data is provided by the memory device to the external pin, the method comprising:
- during the write mode and the read mode, comparing an output voltage apparent at the external pin with a reference voltage;
- generating a pull-up driving code in response to the comparison of the output voltage and reference voltage and a pull-up calibration code, and applying the pull-up driving code to control a pull-up driver;
- generating a pull-down driving code in response to the comparison of the output voltage and reference voltage and a pull-down calibration code, and applying the pull-down driving code to control a pull-down driver;
- by operation of at least one of the pull-up driver and pull-down driver, presenting a termination impedance to the transmission line at the external pin during the write mode, and presenting a drive impedance, different from the termination impedance, to the transmission line at the external pin during the read mode, wherein a value of the termination impedance is adjusted in real time during the write mode, and a value of the driving impedance is adjusted in real time during the read mode.

16. The method of claim 15, further comprising:
- receiving a pull-up ZQ code and a pull-down ZQ code;
- generating the pull-up driving code in further response to the pull-up ZQ code; and
- generating the pull-down driving code in further response to the pull-down ZQ code.

17. The method of claim 15, further comprising:
- by operation of at least one of the pull-up driver and pull-down driver, presenting the termination impedance to the transmission line at the external pin during a normal mode that is not one of the write mode and the read mode.

18. The method of claim 17, wherein the normal mode is one of an idle mode, a standby mode, a pre-charge mode, a power-down mode, a refresh mode, and a memory bank active mode.

19. A data output buffer of a memory device, wherein the memory device is capable of operating in a write mode during which externally provided data is provided to an external pin via a transmission line and in a read mode during which read data is provided by the memory device to the external pin, the data output buffer comprising:
- a driving unit including a pull-up driver and a pull-down driver coupled to the external pin and configured to present a termination impedance during the write mode, and a drive impedance, different from the termination impedance, during the read mode;
- a control unit configured during the write mode and the read mode to compare an output voltage apparent at the external pin with a reference voltage, generate a pull-up driving code applied to the pull-up driver in response to the comparison of the output voltage and reference voltage and a pull-up calibration code, and generate a pull-down driving code applied to the pull-down driver in response to the comparison of the output voltage and reference voltage and a pull-down calibration code,
- wherein a value of the termination impedance is adjusted in real time during the write mode, and a value of the driving impedance is adjusted in real time during the read mode by at least one of the pull-up driving code and the pull-down driving code.

20. The data output buffer of claim 19, wherein the control unit is further configured to generate the pull-up driving code in response to a pull-up ZQ code, and to generate the pull-down driving code in response to a pull-down ZQ code.

21. The data output buffer of claim 19, wherein the control unit comprises a calibration unit comprising:
- a clock generator configured to generate a clock signal while a first calibration signal is enabled;
- a comparator configured to generate a comparison signal in response to the comparison of the output voltage with the reference voltage;
- a counting unit configured to generate a counting value by performing a count-up operation or a count-down operation in response to the clock signal and the comparison signal;
- a first register configured to store the counting value and provide a stored counting value as the pull-up calibration code; and
- a second register configured to store the counting value and provide a stored counting value as the pull-down calibration code.

22. The data output buffer of claim 21, wherein the counting unit comprises:
- a counter configured to generate the counting value by performing a count-up operation or a count-down operation synchronously with the clock signal based on a logic level of the comparison signal, the counter being configured to reset the counting value when the first calibration signal is enabled; and
- a de-multiplexer configured to selectively provide the counting value to one of the first register and the second register in response to the second calibration signal.

23. The data output buffer of claim 21, wherein the calibration unit further comprises:
- a reference voltage generator that generates the reference voltage, the reference voltage generator including a first resistor coupled between the supply voltage and a first node and a second resistor coupled between the first node and the ground voltage, the reference voltage generator being configured to output the reference voltage at the first node.

24. The data output buffer of claim 19, wherein the control unit comprises a switching unit configured to provide one of the pull-up driving code to the pull-up driver while turning off the pull-down driver, and the pull-down driving code to the pull-down driver while turning off the pull-up driver.

* * * * *